(12) United States Patent
Eroz et al.

(10) Patent No.: US 9,397,704 B2
(45) Date of Patent: *Jul. 19, 2016

(54) METHOD AND APPARATUS FOR WIRELESS DATA TRANSMISSION SUBJECT TO PERIODIC SIGNAL BLOCKAGES

(71) Applicant: Hughes Network Systems, LLC, Germantown, MD (US)

(72) Inventors: Mustafa Eroz, Germantown, MD (US); Lin-Nan Lee, Potomac, MD (US)

(73) Assignee: Hughes Networks Systems, LLC, Germantown, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/685,854

(22) Filed: Apr. 14, 2015

(65) Prior Publication Data

US 2015/0222294 A1 Aug. 6, 2015

Related U.S. Application Data

(63) Continuation-in-part of application No. 13/422,534, filed on Mar. 16, 2012, now Pat. No. 9,009,559.

(51) Int. Cl.
*H03M 13/00* (2006.01)
*H03M 13/25* (2006.01)
(Continued)

(52) U.S. Cl.
CPC .......... *H03M 13/2792* (2013.01); *H03M 13/27* (2013.01); *H03M 13/373* (2013.01); *H04B 7/18506* (2013.01); *H04L 1/0009* (2013.01); *H04L 1/0041* (2013.01); *H04L 1/0042* (2013.01); *H04L 1/0057* (2013.01); *H04L 1/0061* (2013.01); *H03M 13/25* (2013.01); *H03M 13/29* (2013.01); *H03M 13/2936* (2013.01); *H03M 13/6561* (2013.01); *H04L 1/004* (2013.01); *H04L 1/0071* (2013.01)

(58) Field of Classification Search
CPC ............ H03M 13/2792; H03M 13/27; H03M 13/373; H03M 13/25; H03M 13/29; H03M 13/2936; H03M 13/6561; H04B 7/18506; H04L 1/0009; H04L 1/0057; H04L 1/0042; H04L 1/0061; H04L 1/0041; H04L 1/004; H04L 1/0071
USPC ........................................................ 714/758
See application file for complete search history.

(56) References Cited

U.S. PATENT DOCUMENTS 5,835,165 A   11/1998   Keate et al.
5,912,902 A   6/1999    Monroe
(Continued)

*Primary Examiner* — James C Kerveros
(74) *Attorney, Agent, or Firm* — Potomac Technology Law, LLC

(57) ABSTRACT

Approaches for satellite data transmissions are provided, which accommodate for periodic signal blockages without packet loss. A data stream is segmented into packets for wireless transmission, wherein the transmission is subject to a periodic blockage, wherein the periodic blockage comprises two blockages occurring within a time period, and each blockage is of a respective duration and recurs at regular intervals based on the time period. A forward error correction outer code is applied to the packets for recovery of data erasures due to the periodic blockage, wherein the application of the outer code comprises applying an error correction code to each of the packets to generate a respective codeblock. Each codeblock is interleaved to prevent erasure of consecutive parity bits within the codeblock. The encoded and interleaved codeblocks are transmitted over a wireless channel, wherein a number of data erasures occur within each codeblock due to the periodic blockage.

16 Claims, 15 Drawing Sheets

(51) Int. Cl.

| | | |
|---|---|---|
| *H03M 13/27* | (2006.01) | |
| *H03M 13/29* | (2006.01) | |
| *H03M 13/37* | (2006.01) | |
| *H04B 7/185* | (2006.01) | |
| *H04L 1/00* | (2006.01) | |

(56) References Cited

U.S. PATENT DOCUMENTS

| | | | |
|---|---|---|---|
| 6,202,189 B1 | 3/2001 | Hinedi et al. | |
| 6,229,824 B1 | 5/2001 | Marko | |
| 6,697,984 B1 * | 2/2004 | Sim | H03M 13/15 370/316 |
| 6,697,985 B1 | 2/2004 | Ilani | |
| 7,134,065 B2 * | 11/2006 | McIntire | H04L 1/0045 714/762 |
| 7,298,696 B1 | 11/2007 | Wu | |
| 8,261,164 B2 | 9/2012 | Nebat | |
| 8,413,012 B2 | 4/2013 | Limberg | |
| 8,437,406 B2 | 5/2013 | Kolze et al. | |
| 2002/0003813 A1 * | 1/2002 | Marko | H03M 13/23 370/477 |

* cited by examiner

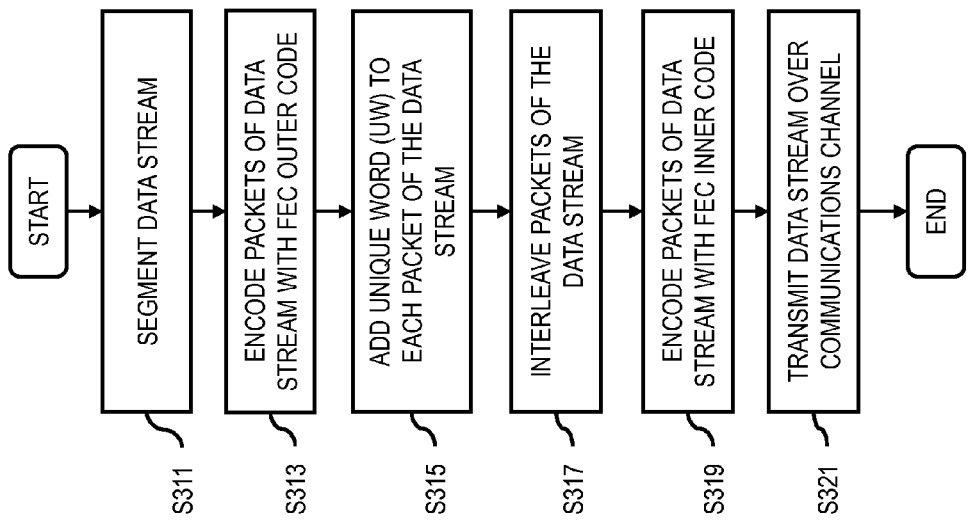

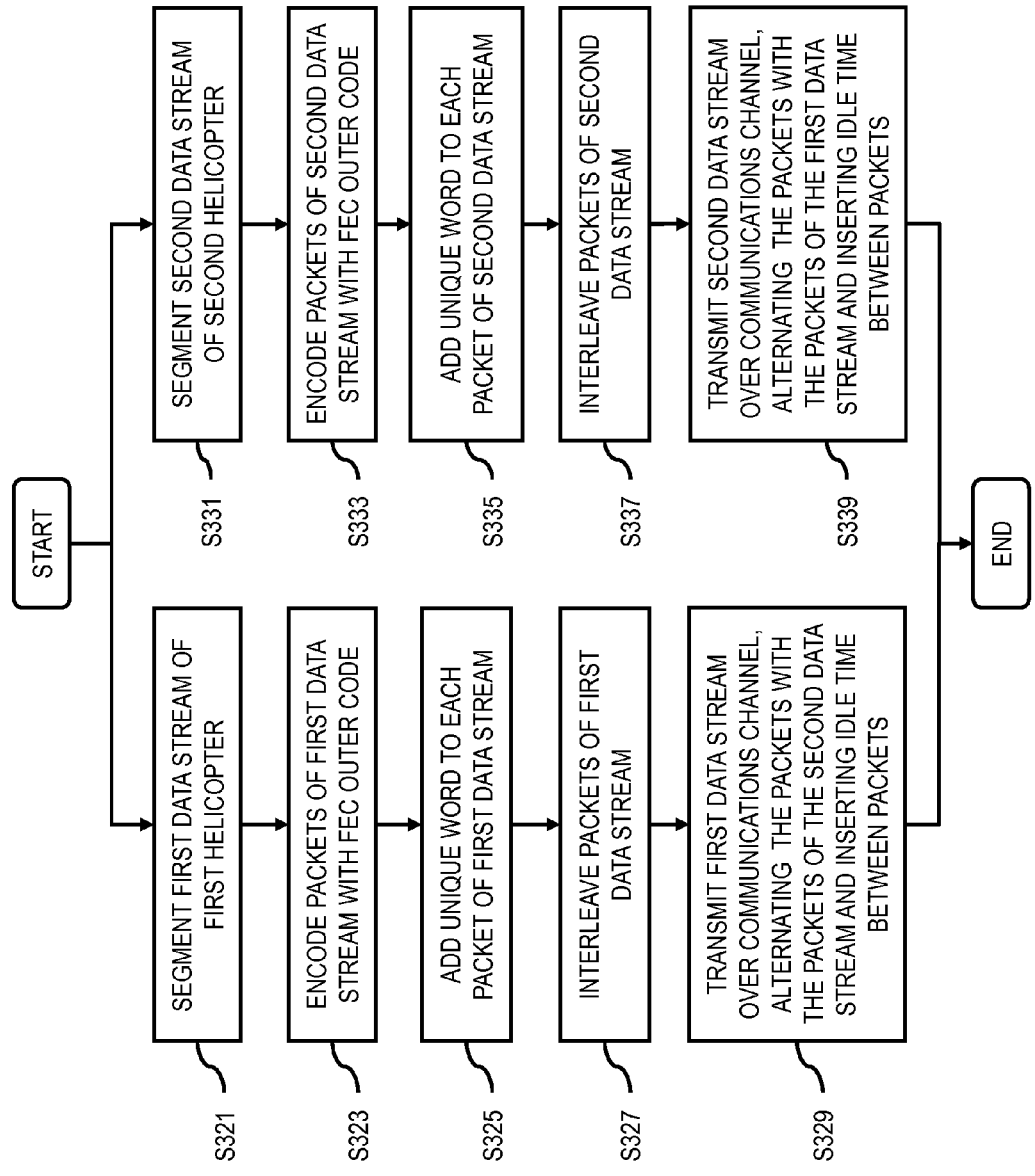

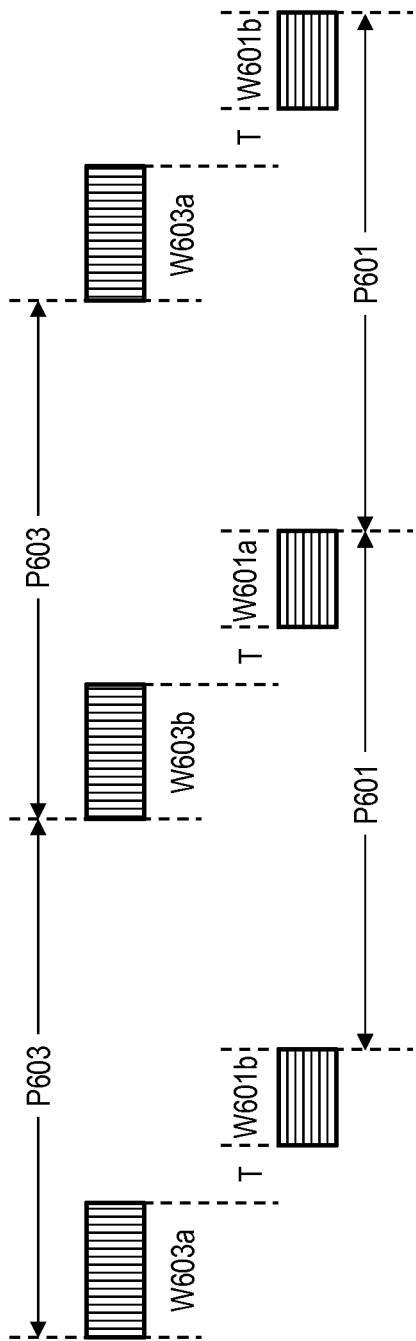

METHOD AND APPARATUS FOR WIRELESS DATA TRANSMISSION SUBJECT TO PERIODIC SIGNAL BLOCKAGES

RELATED APPLICATIONS

This application is a continuation-in-part (CIP), and claims the benefit of the earlier filing date under 35 U.S.C. §120, from U.S. patent application Ser. No. 13/422,534, filed Mar. 16, 2012, now U.S. Pat. No. 9,009,559.

FIELD

The present invention relates to data transmission in a satellite communications system, and more specifically to data transmission in a satellite communications system, where the data transmission is subject to periodic short duration blockages of the transmission signal to and from the satellite terminal.

BACKGROUND

Modern satellite communication systems provide a pervasive and reliable infrastructure to distribute voice, data, and video signals for global exchange and broadcast of information. Such satellite communication systems also have emerged as infrastructure networks for data communications and entertainment services on-board aircraft. For example, satellite communications networks are now used for broadband services (e.g., Internet access and e-mail and other messaging services) and entertainment (e.g., satellite television and video streaming services) aboard commercial airliners. Further, satellite communications are increasingly used for data communications in other aircraft applications, such as government aircraft applications (e.g., military and first responder aircraft applications), including helicopters.

Additionally, in communications systems, system performance may be aided by employing forward error correction (FEC) or channel coding. Moreover, nearly all such satellite communications systems rely on some form of error control coding for managing errors that may occur due to noise and other factors during transmission of information through the satellite communication channel. Efficient error control schemes implemented at the transmitting end of these communications systems have the capacity to enable the transmission of data (e.g., audio, video, text, etc.) with very low error rates within a given signal-to-noise ratio (SNR) environment. Powerful error control schemes also enable a communications system to achieve target error performance rates in environments with very low SNR, such as in satellite and other wireless systems, where noise is prevalent and high levels of transmission power are costly. More powerful error control schemes, however, result in more complex and costly implementations, if even feasible. Further, in addition to FEC coding, satellite communications systems typically also employ interleaving to improve the performance of the FEC coding.

With respect to helicopters, however, due to physical constraints of helicopter airframes, the signal path between the satellite and the satellite antenna is blocked by the rotary wings, also known as the blades. The period between blockages generally depends on the aircraft design. The duration of the blockages are of a relatively short period of time, depends on a number of parameters, including the width of the blades, the distance between the rotor and the antenna, the azimuth and elevation angle of the satellite, as well as the clearance height between the antenna and the blades. Additionally, the speed of the rotor affects both the periods between blockages and the duration of the blockage. Typically, thermal noise, with Doppler if on a mobile platform, produces the main impairment experienced over the channel for satellite transmissions via a tracking antenna with high directivity. For helicopter-mounted antennas, however, the blockage of the blades adds an additional impairment that dominates transmission performance, overshadowing the effects of thermal noise. Also, multi-paths generated by reflection from the nearest blades and aircraft body can also be an issue, but is generally secondary for highly directed antennas at Ku and Ka band frequencies. The periodic blockage of the blades generally creates two problems. First, receiver synchronization is disrupted by the signal interruption, which can result in loss of synchronization. Loss of synchronization then requires execution of a search and synchronization algorithm to reestablish synchronization. Further, if the next blade blockage occurs prior to reestablishing synchronization, the synchronization algorithm may be further disrupted and/or delayed. Second, data packets or frames transmitted during the period of a blockage is either completely lost or severely attenuated. Accordingly, at the time a blockage begins, and during the duration of the blockage, one or more transmitted data packets will be partially cut-off and/or entirely blocked.

Two prior alternatives are known for addressing such periodic blockage by helicopter blades. A first of these alternatives is to synchronize the data transmissions with the blade rotation. This approach is potentially possible for the return link by monitoring the forward link signal strength to determine the presence of a clear path—that is, if the forward link signal is always transmitted. A problem with this approach is that a latency is involved, and the transmission must be completed before the blockage by the next blade occurs. It is not practical, however, for the network hub to track the blade position of a helicopter on the forward link. Also, with this approach, it is impossible for multiple helicopters to share a single forward link carrier simultaneously, because it is not possible to synchronize individual transmissions to each helicopter, as their blades positions are not synchronized. This technique, therefore, is only useful for the helicopter to hub, or return link, transmissions. The second alternative recovers blocked information through retransmission. Common automatic repeat request (ARQ) retransmission, however, will not work properly, because the blockage can cause an error rate much higher than what is normally expected for ARQ systems to work. Further, the latency for reliable information delivery can be very long due to high retransmission rates. Furthermore, because acknowledgements and repeat requests from the receiving end also have the same blockage issue, a special protocol design taking into account the periodic blockage in both directions is required. A variation of the ARQ technique is to simply repeat the transmission about one half of the blockage period later. In this way, at least one of the data transmissions is assured not to be blocked, but this approach also requires duplicate detection at the receive end to properly reassemble the data stream. Moreover, with this approach, throughput is reduced by less than half, wasting significant bandwidth.

What is needed, therefore, are approaches for data transmissions in a satellite communications system, which accommodate for periodic short duration blockages of the transmission signal to and from a satellite terminal, without packet loss due to the transmission blockages, while employing a robust FEC data recovery schemes.

SOME EXAMPLE EMBODIMENTS

The present invention advantageously addresses the foregoing requirements and needs, as well as others, by providing approaches for data transmissions in a satellite communications system, which accommodate for periodic short duration blockages of the transmission signal to and from a satellite terminal, without packet loss due to the transmission blockages, while employing a robust FEC data recovery schemes.

In accordance with example embodiments, a method is provided for data transmissions in a satellite communications system, which accommodates for periodic blockages of the transmission signal to and from a satellite terminal, without packet loss due to the transmission blockages, while employing a robust FEC data recovery schemes. A data stream is segmented into packets of a fixed-size for a burst-mode transmission over a wireless channel, wherein the transmission is subject to a periodic blockage, wherein the periodic blockage comprises at least two blockages occurring within a time period, and each blockage is of a respective duration and recurs at regular intervals based on the time period. A forward error correction (FEC) outer code is applied to the packets of the data stream for recovery of data erasures due to the periodic blockage, wherein the application of the FEC outer code comprises applying an error correction code to each of the packets to generate a respective codeblock. Each codeblock is interleaved in a manner designed to substantially prevent erasure of consecutive parity bits within the codeblock by the periodic blockage. The encoded and interleaved codeblocks are transmitted over the wireless channel, wherein a number of the data erasures occur within each codeblock due to the periodic blockage.

By way of example, the FEC outer code comprises a low density parity check code configured to optimize the recovery of the number of data erasures within each codeblock. By way of further example, the interleaving of each codeblock comprises writing each bit of the codeblock into an interleaver matrix of n rows and m columns in a row-by-row manner, shuffling the bits of each row within the row, and reading the shuffled bits from each row of the interleaver matrix in the row-by-row manner. By way of further example, the shuffling of the bits of each row comprises shuffling each bit of an original position k within the row to a new position within the row according to the following scheme: $k \rightarrow (k \times c_i)$ mod m, where $c_i$ is a row-dependent constant. By way of further example, $c_i$ and m are relatively prime. By way of further example, the wireless channel comprises a channel in a satellite communications system, the transmission comprises a data transmission of a satellite terminal installed on a helicopter having multiple rotor blades, and each blockage within the time period comprises a blockage by a blade of a respective one of the rotors.

According to a further embodiment of the method, a unique word (UW) is added to each of the packets of the data stream for acquisition of one or more of a frequency, carrier phase and symbol timing of the respective packet. According to yet a further embodiment of the method, a forward error correction (FEC) inner code is applied to each encoded and interleaved codeblock. By way of example, the FEC inner code comprises one of a low density parity check code (LDPC), a convolutional code, and a turbo code.

In accordance with further example embodiments, an apparatus is provided for data transmissions in a satellite communications system, which accommodates for periodic blockages of the transmission signal to and from a satellite terminal, without packet loss due to the transmission blockages, while employing a robust FEC data recovery schemes. The apparatus comprises at least one processor and at least one memory including computer program code for one or more programs, wherein the at least one memory and the computer program code configured to, with the at least one processor, cause the apparatus to perform certain specified tasks. The apparatus segments a data stream into packets of a fixed-size for a burst-mode transmission over a wireless channel, wherein the transmission is subject to a periodic blockage, wherein the periodic blockage comprises at least two blockages occurring within a time period, and each blockage is of a respective duration and recurs at regular intervals based on the time period. The apparatus applies a forward error correction (FEC) outer code to the packets of the data stream for recovery of data erasures due to the periodic blockage, wherein the application of the FEC outer code comprises applying an error correction code to each of the packets to generate a respective codeblock. The apparatus interleaves each codeblock in a manner designed to substantially prevent erasure of consecutive parity bits within the codeblock by the periodic blockage. The apparatus transmits the encoded and interleaved codeblocks over the wireless channel, wherein a number of the data erasures occur within each codeblock due to the periodic blockage.

By way of example, the FEC outer code comprises a low density parity check code configured to optimize the recovery of the number of data erasures within each codeblock. By way of further example, the interleaving of each codeblock comprises writing each bit of the codeblock into an interleaver matrix of n rows and m columns in a row-by-row manner, shuffling the bits of each row within the row, and reading the shuffled bits from each row of the interleaver matrix in the row-by-row manner. By way of further example, the shuffling of the bits of each row comprises shuffling each bit of an original position k within the row to a new position within the row according to the following scheme: $k \rightarrow (k \times c_i)$ mod m, where $c_i$ is a row-dependent constant. By way of further example, $c_i$ and m are relatively prime. By way of further example, the wireless channel comprises a channel in a satellite communications system, the apparatus consists of or is part of a satellite terminal located on a helicopter having multiple rotor blades, the transmission comprises a data transmission of the satellite terminal, and each blockage within the time period comprises a blockage by a blade of a respective one of the rotors.

According to a further embodiment of the apparatus, the apparatus adds a unique word (UW) to each of the packets of the data stream for acquisition of one or more of a frequency, carrier phase and symbol timing of the respective packet. According to yet a further embodiment of the apparatus, the apparatus applies a forward error correction (FEC) inner code to each encoded and interleaved codeblock. By way of example, the FEC inner code comprises one of a low density parity check code (LDPC), a convolutional code, and a turbo code.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3A illustrates a flow chart depicting the process of a data transmission in a wireless communications system, according to an example embodiment;

FIG. 3B illustrates a flow chart depicting the process of two data transmissions sharing a channel in a wireless communications system, according to an example embodiment;

FIG. 6C illustrates timing relationships with respect to the rotors of the helicopter of FIGS. 6A and 6B and the relative periods of interference with the satellite terminal, according to example embodiments;

DETAILED DESCRIPTION

Approaches for data transmissions in a satellite communications system, which accommodate for periodic short duration blockages of the transmission signal to and from a satellite terminal, without packet loss due to the transmission blockages, while employing a robust FEC data recovery schemes, are described. In the following description, for the purposes of explanation, numerous specific details are set forth in order to provide a thorough understanding of the invention. It is apparent, however, that the invention may be practiced without these specific details or with an equivalent arrangement. In other instances, well known structures and devices are shown in block diagram form in order to avoid unnecessarily obscuring the invention.

Figure 1A:
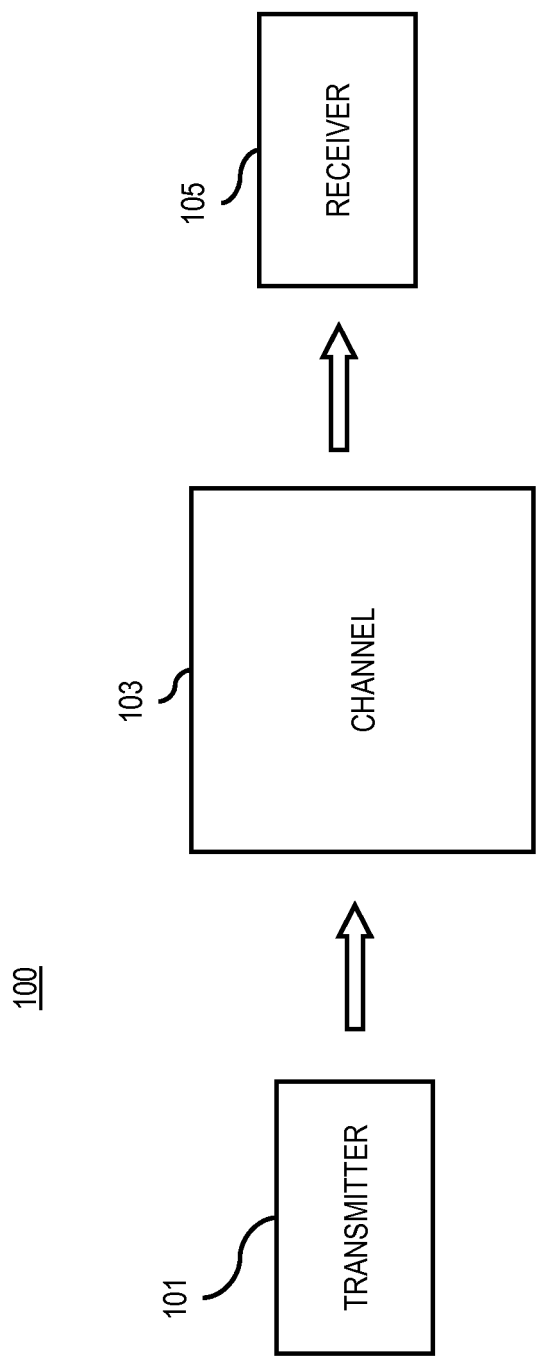
FIGS. 1A and 1B illustrate communications systems capable of employing data transmission that accommodates for a periodic short duration blockage of the transmission signal to and from the communications terminal, in accordance with example embodiments.
Figure 1B:
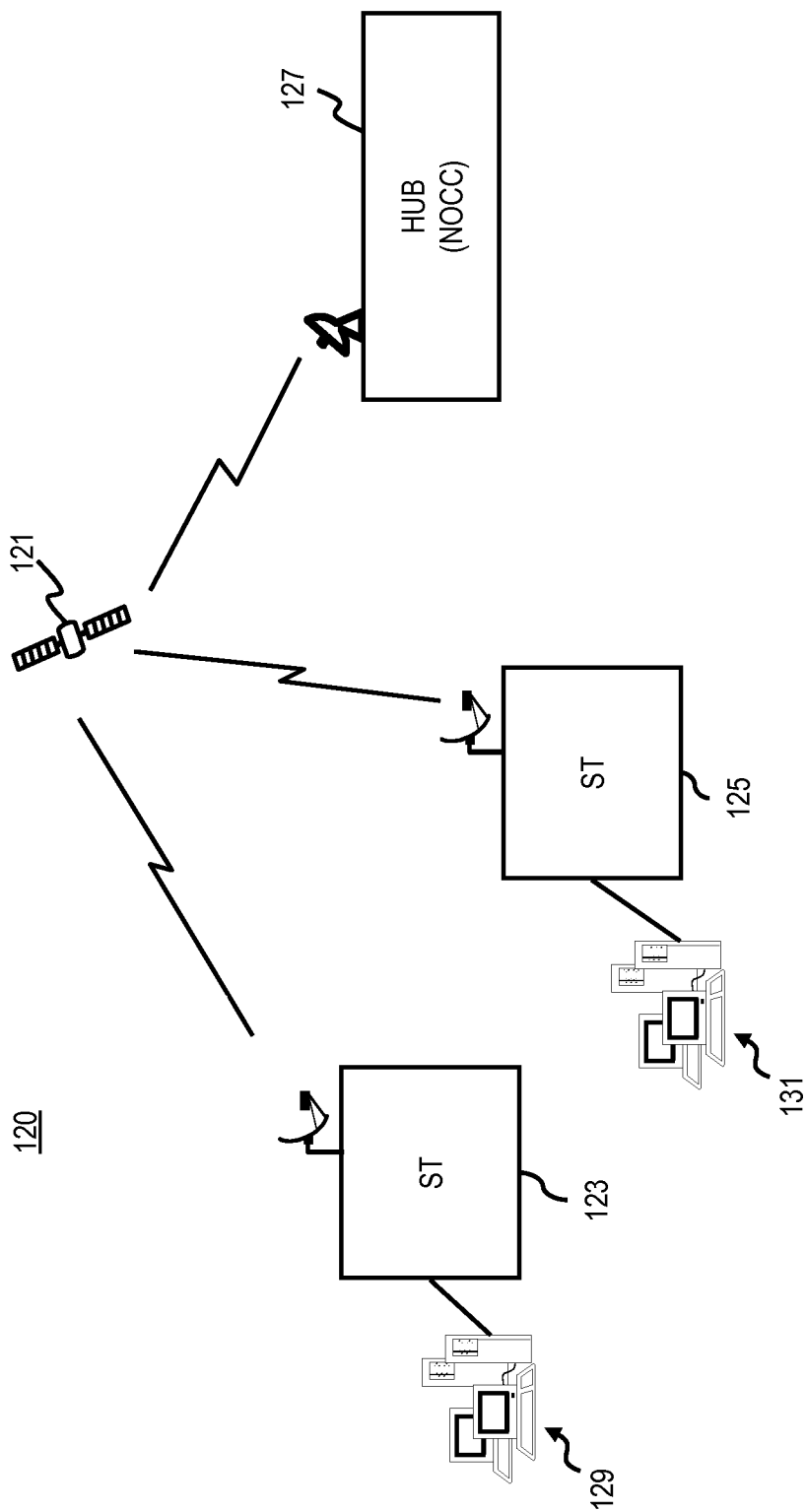

FIGS. 1A and 1B illustrate communications systems capable of utilizing data transmissions that accommodate for a periodic short duration blockage of the transmission signal to and from the satellite terminal, according to various example embodiments of the present invention. A digital communications system 110 includes one or more transmitters 111 (of which one is shown) that generate signal waveforms across a communication channel 113 to one or more receivers 115 (of which one is shown). In this discrete communications system 110, the transmitter 111 has a message source that produces a discrete set of possible messages, where each of the possible messages has a corresponding signal waveform. These signal waveforms are attenuated, or otherwise altered, by communications channel 113. To combat the noise channel 113, coding is utilized. For example, forward error correction (FEC) codes can be employed.

FEC is desired in terrestrial and satellite systems to provide high quality communication over a radio frequency (RF) propagation channel, which induces signal waveform and spectrum distortions, including signal attenuation (freespace propagation loss), multi-path induced fading and adjacent channel interference. These impairments drive the design of the radio transmission and receiver equipment; example design objectives include selecting modulation formats, error control schemes, demodulation and decoding techniques and hardware components that together provide an efficient balance between system performance and implementation complexity. Differences in propagation channel characteristics, such as between terrestrial and satellite communication channels, naturally result in significantly different system designs. Likewise, existing communications systems continue to evolve in order to satisfy increased system requirements for new higher rate or higher fidelity communication services.

FIG. 1B is a diagram of an example satellite communications system 120 capable of supporting communication among terminals with varied capabilities, according to an embodiment of the present invention.

Satellite communications system 120 includes a satellite 121 that supports communication among multiple satellite terminals (STs) 123, 125 and a hub 127. The HUB 127 may assume the role of a Network Operations Center (NOC), which controls the access of the STs 123, 125 to the system 120 and also provides element management functions and control of the address resolution and resource management functionality. The Satellite communications system 120 may operate as a traditional bent-pipe system, where the satellite essentially operates as a repeater. Alternatively, the system 120 may employ a switching or processing satellite supporting mesh communications (point-to-point communications directly between, for example, the two STs 123 and 125). The STs 123, 125 provide connectivity to one or more hosts 129, 131, respectively. The hosts 129, 131 may comprise various types of data communications-based equipment depending upon the particular application.

In a traditional bent-pipe system of an example embodiment, the satellite operates as a repeater or bent pipe, and communications between the STs 123 and 125 are transmitted over a double-hop path. For example, in a communication from ST 123 to ST 125, over the first hop, the communication is transmitted, via the satellite, from the ST 123 to the HUB 127. The HUB 127 decodes the communication and determines the destination ST 125. The HUB 127 then appropriately addresses and repackages the communication, encodes and modulates it, and transmits the communication over the second hop, via the satellite, to the destination ST 125. Accordingly, the satellite of such a system acts as a bent pipe or repeater, transmitting communications between the HUB 127 and the STs.

In an alternate embodiment, with a communications system 120 that employs a processing satellite (e.g., including a packet switch operating, for example, at a data link layer), the system may support direct unicast (point-to-point) communications and multicast communications among the STs 123, 125. In the case of a processing satellite, the satellite 121 decodes the received signal and determines the destination ST or STs (as the hub 127 would in a bent-pipe system). The satellite 121 then addresses the data accordingly, encodes and modulates it, and transmits the modulated signal, over the channel 113, to the destination ST or STs (e.g., ST 125) According to one embodiment of the present invention, the system 120 has a fully meshed architecture, whereby the STs 123, 125 may directly communicate.

Figure 2:
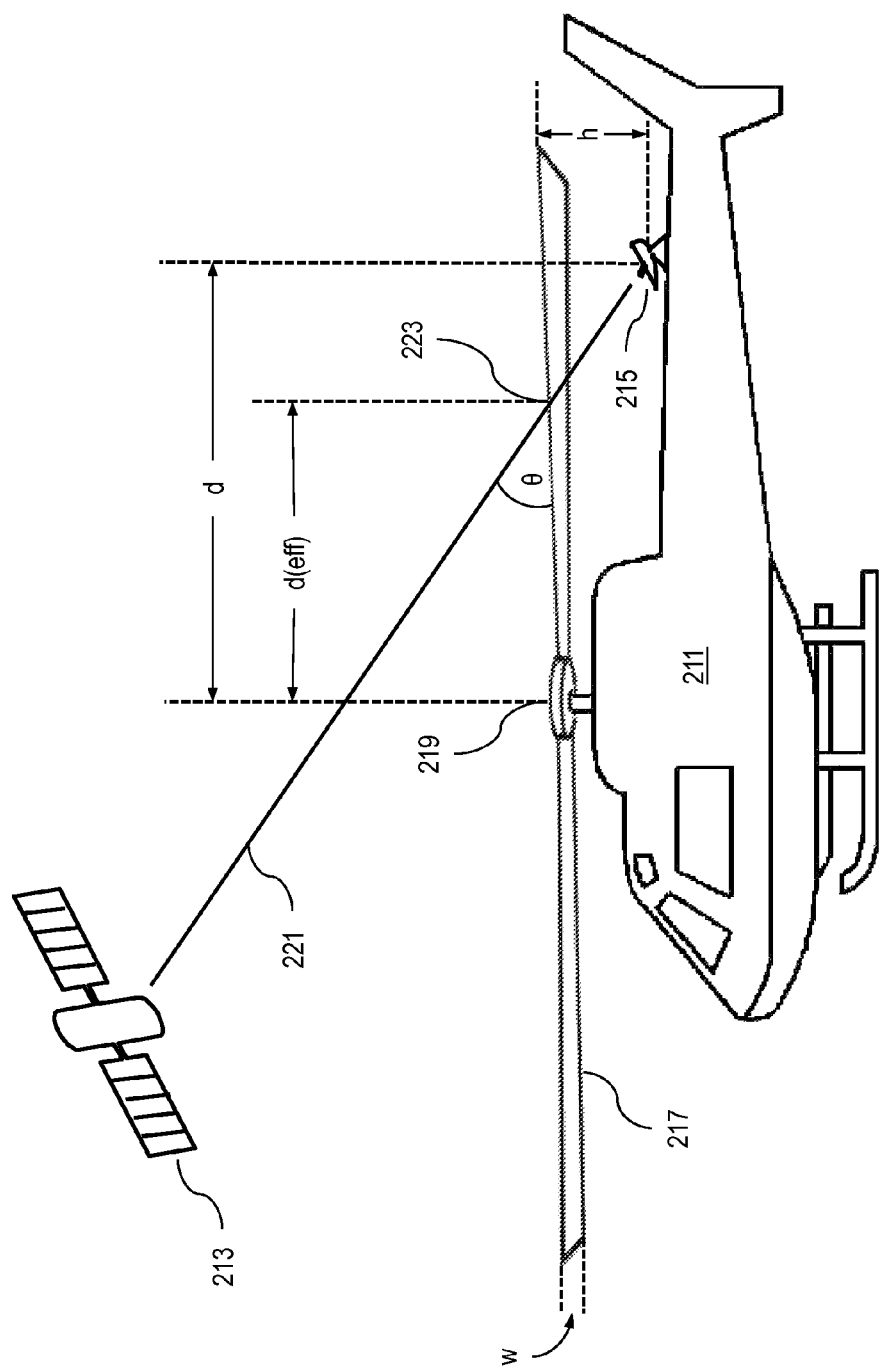
FIG. 2 illustrates various parameters that affect the period and duration of the transmission signal blockage for a satellite terminal antenna mounted on the body of a helicopter, according to an example embodiment.

FIG. 2 illustrates various parameters that affect the period and duration of the transmission signal blockage for a satellite terminal antenna, for example, mounted on the body of a helicopter 211 with a single rotor with two blades 217, according to an example embodiment. As mentioned above, due to physical constraints of helicopter airframes, such as the helicopter 211, the transmissions between the satellite 213 and the satellite antenna 215 is blocked by the blades 217 of the helicopter. The period between blockages generally depends on the aircraft design. The duration of each blockage is of a relatively short period of time, and depends on a number of parameters. Such parameters include the width of the blades 217 (w), the distance between the rotor 219 and the antenna 215 (d), the azimuth and elevation angle of the satellite 213 ($\theta$), as well as the clearance height between the antenna 215 and the blades 217 (h). Additionally, the speed of the rotor affects both the periods between blockages and the duration of the blockage. The effective distance (d(eff)) between the rotor 219 and the point 223 the satellite signal 221 intersects with the blades 217, and the width of the blade at that point determine the fraction of time during each period the signal 221 will be blocked.

Referring to FIG. 3A, according to an example embodiment, the transmission of the satellite terminal 123 (for example) is configured as a burst-mode transmission, whereby the data stream is segmented into fixed size datagrams or packets (S311). Accordingly, even though the transmission may be from a single transmitter, instead of a continuous mode demodulator 227, the receiver utilizes a coherent burst demodulation technique, such as techniques typically used for Time Division Multiple Access (TDMA) systems. Unlike common TDMA transmission systems, however, in the cases where the packets are transmitted from a single helicopter, no idle time is needed between the packets. Alternatively, in cases of time multiplexing of data streams from more than one helicopter, the insertion of an idle time between each packet would be required to provide sufficient guard time between transmission bursts from different helicopters.

The packets must be of a size reflecting a fraction of the transmission duration that is free of any blockage from the blades 217. If the size of a packet is larger than the blockage-free duration of transmissions, then every packet will be partially blocked or attenuated. With respect to the duration of the blockage from a blade, there is a tradeoff between packet size and data loss. For increased efficiency, the packet should also be of a size smaller than the duration of the blockage. A tradeoff, however, arises with respect to the packet size. Where the packet size is smaller than the blockage duration, because the packets and the blades are not synchronized, a blade will generally block two packets partially, with possibly one or more completely blocked packets between the two partially blocked packets. Accordingly, longer packets effectively cause increased data loss, because a partially blocked packet is treated in the same manner as a fully blocked packet. On the other hand, while a very short packet size would reduce this loss in efficiency, each packet introduces overhead (e.g., UW and header processing) and inefficiencies resulting therefrom. Accordingly, the overhead can become significant for small packets. According to one example embodiment, the preferred packet size is about half of the blockage duration or somewhat larger, but no more than the blockage duration. With a packet size of half the blockage duration, for example, for a blockage free duration to blockage duration ratio of n:1, generally n−1 packets out of n+1 can be expected to be transmitted without being subject to a blockage. For example, according to an example satellite terminal antenna installation on a helicopter, with a reasonable satellite angle, the ratio is about 9:1, whereby 8 out of 10 packets could be successfully transmitted during a blockage free duration.

Once the packet size is selected to optimize efficiency of the transmission, an outer forward error correction (FEC) coding is applied to ensure that a data stream has been transmitted uninterrupted and to facilitate recovery of packets that have been subject to the periodic blockage (S313). The employment of such an outer FEC code, however, does not affect the more powerful inner FEC coding applied for other channel issues such as thermal noise, fading, adjacent channel interference, etc. For example, such inner codes may comprise convolutional codes, low density parity check (LDPC) codes, or turbo codes. For example, turbo coding represents an iterated soft-decoding scheme that combines two or more relatively simple convolutional codes and an interleaver to produce a block code that can perform to within a fraction of a decibel of the theoretical bound (Shannon limit). LDPC codes represent a class of linear block codes constructed based on a sparse parity-check matrix. Both LDPC codes as well as some classes of turbo codes have been successfully demonstrated to approach near the theoretical bound.

According to one example embodiment, for the outer code, a checksum packet is employed as the basic FEC building block. A checksum packet, for example, is formed by performing an exclusive-OR summation over a number of packets (m). In other words, the first bit of each of the m packets are binary added together to form the first bit of the checksum packet, the second bit of each of the m packets are binary added together to form the first bit of the checksum packet, etc., all the way up to the $m^{th}$ bit of each of the m packets being binary added together to form the $m^{th}$ bit of the checksum packet. The checksum packet is transmitted as the $(m+1)^{th}$ packet. Such an FEC code has a code rate of m/(m+1). When any one of the m information packets is damaged, it is detected by its own cyclic parity check or cyclic redundancy check (CRC) code. The damaged packet can then be recovered through an exclusive-OR operation of the other m−1 packets with the checksum packet. Accordingly, the checksum packet can only recover one blocked packet within the set of m packets.

Further, a unique word (UW) is added at the beginning of each packet (S315). In addition to signaling the beginning of a packet, the UW also serves as a synchronization pattern for the burst demodulator to acquire the frequency, carrier phase, and symbol timing for the respective packet. The receiver acquisition method is thus on a burst-by-burst basis, where, provided the UW is successfully obtained, the data packet should be readily attainable. Moreover, even where a packet is attenuated to the point where the UW or part of the burst is unattainable, subsequent bursts will be clear and then (based on the FEC coding) the lost or attenuated burst can be recovered. Accordingly, neither the transmitter nor the receiver is required to know or track the position of the helicopter blades. Provided that the burst or packet size and the interleaver length are optimized for the system parameters, in the case of either fully or partially blocked packets, the FEC coding will facilitate recovery of such blocked packets.

As discussed above, however, the checksum packet can only recover one blocked packet within the set of m packets. As also discussed above, however, more than one packet is affected by the duration of a blockage, and thus, because the checksum packet can only recover one blocked packet, interleaving must be introduced to ensure only one blocked packet is included in the group of m packets reflected by each checksum packet. Accordingly, the packets of the data stream are interleaved based on a predetermined interleaver (S317), where the number of packets (m) is based on the required depth of the interleaver. In other words, if the number of erroneous packets covered by the checksum packet exceeds the error recovery capabilities of the FEC coding, then the system will be unable to recover the lost packets. Interleaving circumvents or diminishes the effects of this problem by shuffling packets across several frames, thereby creating a more uniform distribution of errors within the capabilities of the FEC coding. An FEC inner code may then be applied to each packet for determining (at the receiver) whether the respective has been successfully transmitted and received (S319). The packets of the data stream are then transmitted over the communications channel (S321).

Referring to FIG. 3B, according to a further example embodiment, in a situation where two or more helicopters share the same channel or carrier, as with the single helicopter scenario discussed above, the transmission from each helicopter is configured as a burst-mode transmission. Each data stream is segmented into fixed size bursts or packets (S321, S331), an outer forward error correction (FEC) coding is applied (S323, S333), a unique word (UW) is added at the beginning of each packet (S325, S335), and the packets are interleaved (S327, S337). The packets of the first and second data streams are then transmitted over the communications channel, alternating the packets of the first data stream with the packets of the second data stream (S329, S339). As with the single helicopter scenario, an FEC inner code may then be applied to each packet for determining (at the receiver) whether the respective has been successfully transmitted and received. Further, in the multi-helicopter scenario, an idle time is allocated between packets in the data stream as transmitted over the communications channel (S329, S339). Further, depending on the carrier size and the data rate of each transmitted stream from an individual helicopter, it is also possible that not all time slots will be occupied all the time.

According to a further example embodiment, a burst may contain several very short packets, each packet having an individual header and cyclic redundancy check (CRC) bits. A UW would be added to each burst, and each burst would have an idle time preceding it. The UW and idle time are considered burst overhead. In this embodiment, the packaging of several short packets in a single burst reduces overhead, as compared to the single packet per burst approach discussed above. In this approach, even if a burst is partially blocked, as long as the UW is not blocked, the receiver would be able to acquire the carrier frequency, phase and clock from the UW packets, and to then recover the packets of the burst that have not been blocked. According to a further embodiment, the UW may be inserted in the middle of each burst, as the mid-amble. In such a scenario, after detecting the UW, the receiver works backwards from the UW to retrieve the first part of the data, and work forward from the UW to retrieve the data after the UW. This implementation is possible as modern satellite receivers sample the received transmission signal, store the data in memory, and subsequently process the data. With a mid-amble, bursts partially blocked at the frontend as well as bursts partially blocked at the backend can be partially recovered, maximizing the overall efficiency of the scheme.

Figure 4:
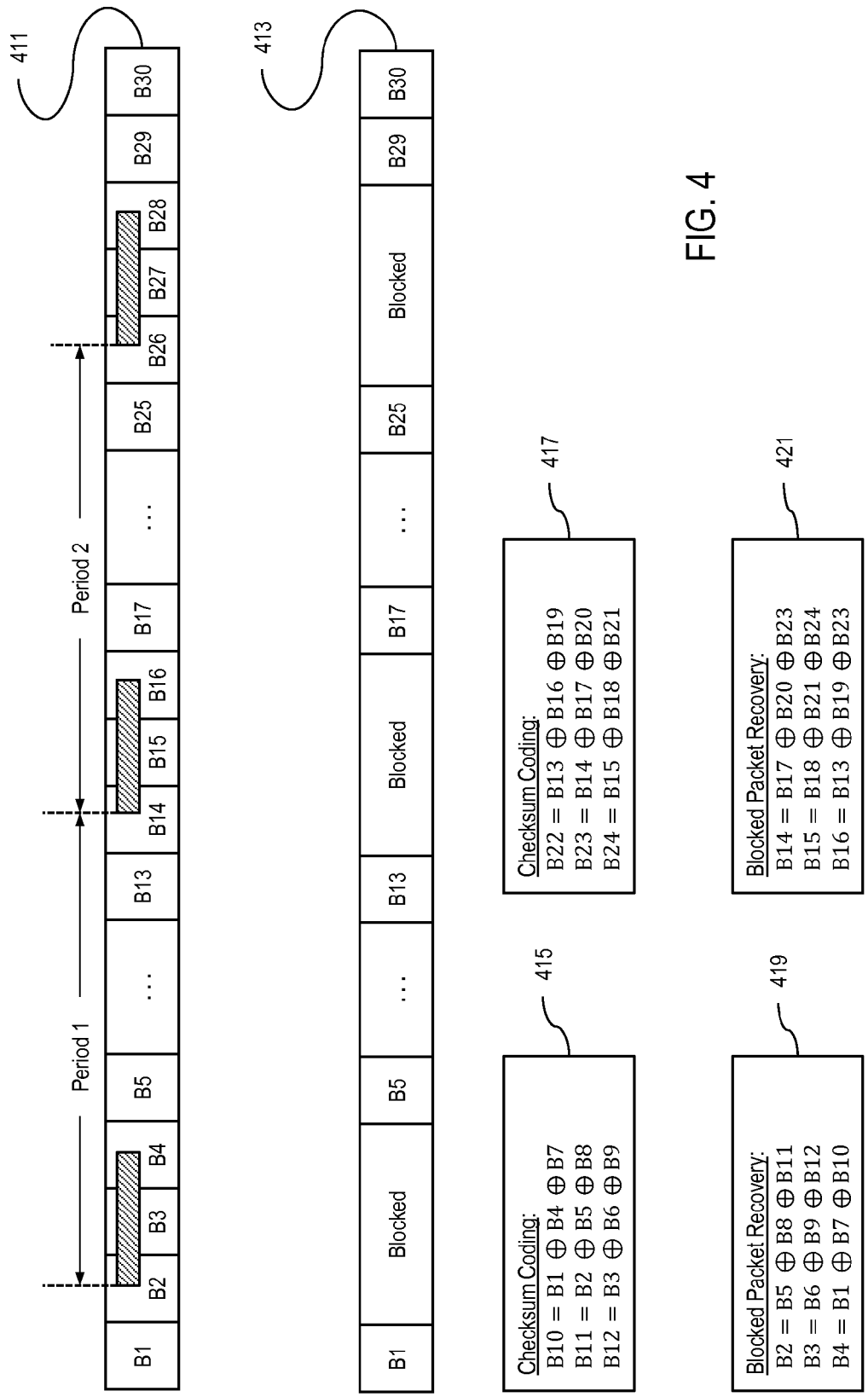
FIG. 4 illustrates an example of a coding scheme for a transmitted data stream that is subject to a periodic blockage, such as from the blades of a helicopter with a single rotor, according to an example embodiment.

FIG. 4 illustrates an example of the coding of a transmitted data stream 411 in view of a periodic blockage, such as from the blades 217 of a helicopter 211. The example of FIG. 4 reflects a blade blockage period of about 12 packets (e.g., Period 1 of packets B2-B13 and period 2 of packets B14-B25, as depicted in FIG. 4), and the blockage duration is about 2 packets in length. In the received data stream 413, while the blockage duration is of a length of only approximately two packets, each passage of a blade causes loss of three consecutive packets (e.g., partial blockage of B2 and B4 and full blockage of B3), followed by 9 blockage free packets (e.g., B5-B13). The interleaving depth, therefore, must be 3, to ensure no more than one blocked packet is reflected by a given checksum packet. Based on the blockage free duration to blockage duration ratio of 9:3 (or 3:1), one checksum packet must be generated for every three data stream packets. Alternatively, for example, if the blockage duration is only 2 packets, the ratio then becomes 5:1, and the interleaving depth is 2, where each checksum packet covers 5 data stream packets. Further, in order to avoid an implementation that is overly marginal, leaving little room for error, the interleaver length may be backed off by one or more packets to provide for a margin for error. In any event, the concept of example embodiments is scalable to virtually any length, which would facilitate data packet recovery where a relatively larger number of packets are interrupted by each blockage duration (e.g., in higher data rate transmission systems).

With respect to the ratio of 3:1, for example, as depicted by the Checksum Coding 415, the first checksum packet would cover packets B1, B4 and B7, and be transmitted as packet B10, the second checksum packet would cover packets B2, B5 and B8, and be transmitted as packet B11, and the third checksum packet would cover packets B3, B6 and B9, and be transmitted as packet B12. This checksum process continues for subsequent blocks of 9 data packets. For example, as depicted by the Checksum Coding 417, the checksum packet B22 would cover packets B13, B16 and B19, checksum packet B23 would cover packets B14, B17 and B20, and checksum packet B24 would cover packets B15, B18 and B21.

Based on this checksum coding, the consecutively blocked packets can then be recovered based on the respective checksum packets. For example, as depicted by the Blocked Packet Recovery 419, data packet B2 can be recovered based on the checksum packet B11 and the associated non-blocked packets B5 and B8, data packet B3 can be recovered based on the checksum packet B12 and the associated non-blocked packets B6 and B9, and data packet B4 can be recovered based on the checksum packet B10 and the associated non-blocked packets B1 and B7. This recovery process then proceeds for subsequent blockage periods. For example, as depicted by the Blocked Packet Recovery 421, data packet B14 can be recovered based on the checksum packet B23 and the associated non-blocked packets B17 and B20, data packet B15 can be recovered based on the checksum packet B24 and the associated non-blocked packets B18 and B21, and data packet B16 can be recovered based on the checksum packet B23 and the associated non-blocked packets B13 and B19.

Moreover, in the multi-helicopter scenario, for example, B1, B2, and B3 are transmitted sequentially by three different helicopters, respectively. Then the burst B4 is transmitted by the first of the three helicopters, and so on. The different helicopters transmit sequentially, at the same data rate. In the case of the 3:1 ratio, however, because only one burst is blocked by the blade for each helicopter during each period, the interleaving is no longer needed. The distribution of the bursts from each helicopter effectively creates a result similar to the interleaving. Depending on the number of helicopters and the blockage free duration to blockage duration ratio, however, interleaving may be required to ensure that the number of blocked packets in a period does not exceed the capabilities of the FEC coding.

Figure 5A:
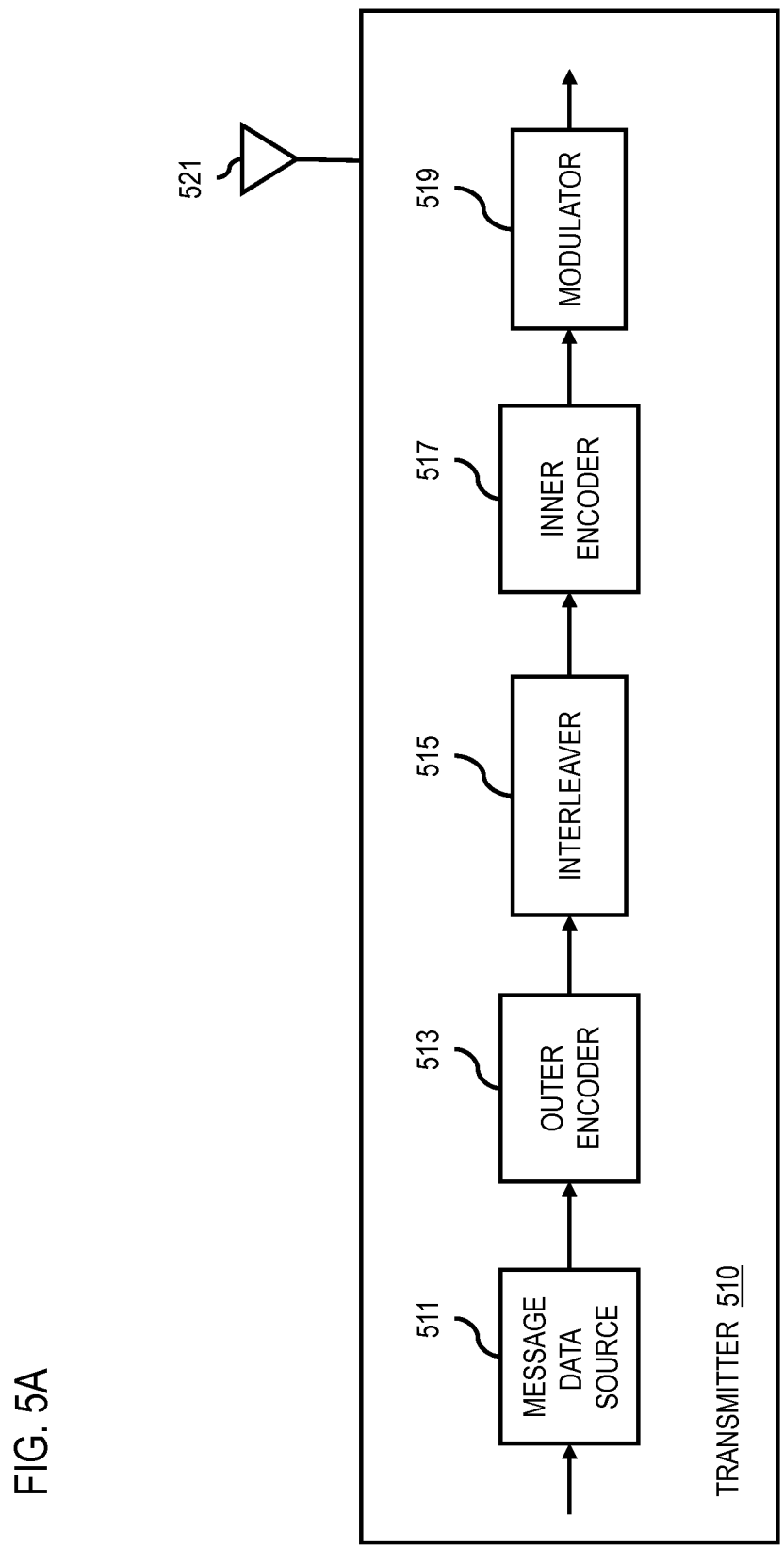
FIG. 5A illustrates a block diagram of an example transmitter configured to operate in the systems of FIGS. 1A and 1B, in accordance with example embodiments.
Figure 5B:
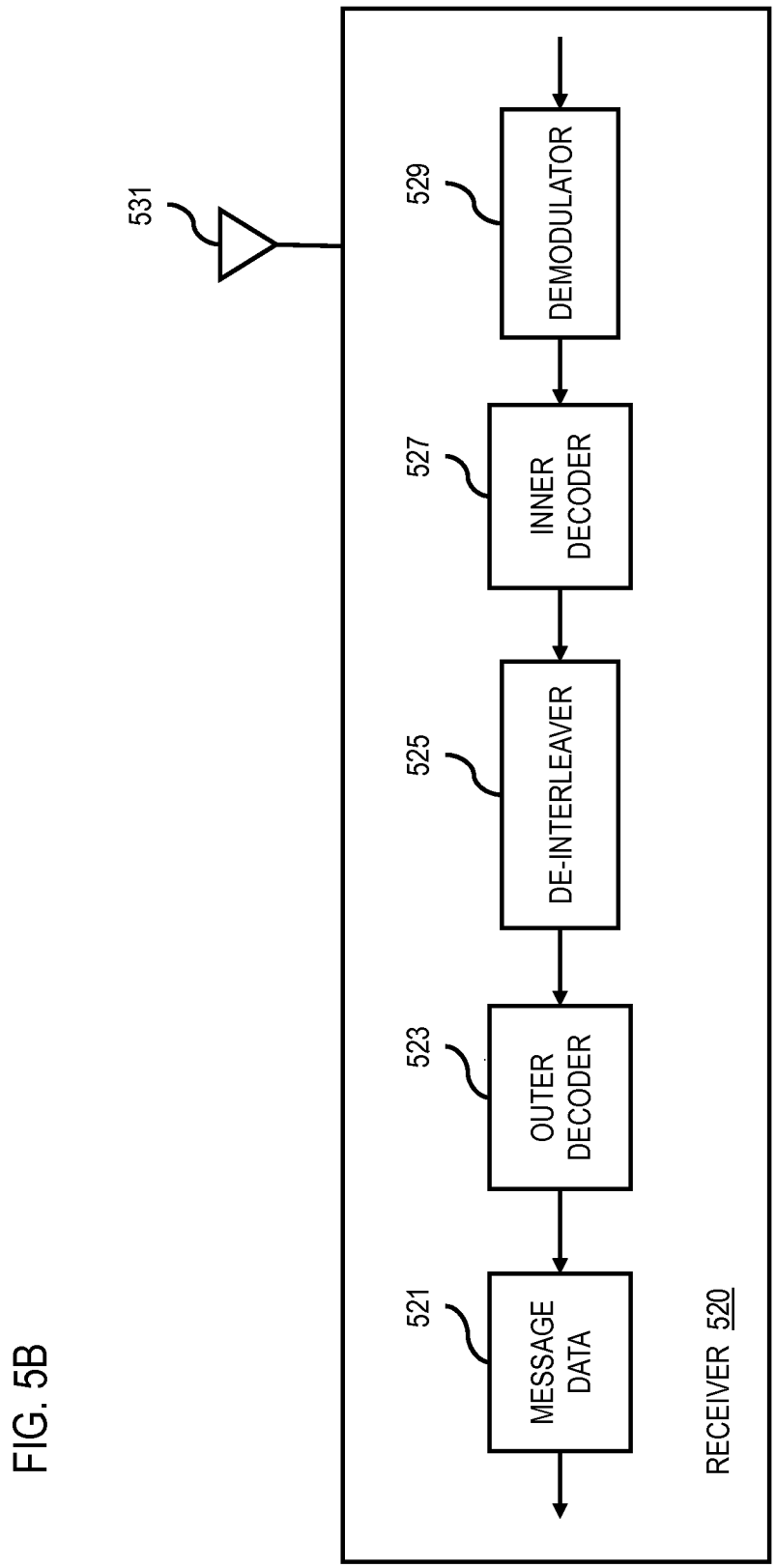
FIG. 5B illustrates a block diagram of an example receiver configured to operate in the systems of FIGS. 1A and 1B, in accordance with example embodiments.

FIG. 5A illustrates a block diagram of an example transmitter 510 configured to operate in the systems of FIGS. 1A and 1B, in accordance with example embodiments of the present invention. FIG. 5B illustrates a block diagram of an example receiver configured to operate in the systems of FIGS. 1A and 1B, in accordance with example embodiments of the present invention. According to a further embodiment, an example of an implementation of a data transmission scheme that accommodates for a periodic short duration blockage of the transmission signal will now be described with reference to the transmitter and receiver of FIGS. 5A and 5B. At the transmitter 510, first the data stream from the data source 511 is segmented into fixed size packets for a burst-mode transmission. The packets are arranged column-by-column, for example, as follows:

| Packet 0 | Packet m | ... | Packet nm |
| Packet 1 | Packet m + 1 | ... | Packet nm + 1 |
| Packet 2 | Packet m + 2 | ... | Packet nm + 2 |
| . | . | | . |
| . | . | | . |
| . | . | | . |
| Packet m − 1 | Packet 2m − 1 | ... | Packet (n + 1)m − 1 |

The outer encoder 513 then applies a single parity check coding is applied as an outer code to the m packets in each column by performing a bit-by-bit exclusive or on every bit of the m packets to obtain a parity check packet, as follows:

| Parity | Packet 0 | Packet m | ... | Packet nm |
| Check | Packet 1 | Packet m + 1 | ... | Packet nm + 1 |
| Coding | Packet 2 | Packet m + 2 | ... | Packet nm + 2 |
| | . | . | | . |
| | . | . | | . |
| | . | . | | . |
| | Packet m − 1 | Packet 2m − 1 | ... | Packet (n + 1)m − 1 |
| | Parity Packet 0 | Parity Packet 1 | | Parity Packet n |

Next, the interleaver 515 interleaves the packets and the inner encoder 517 encodes each packet with an FEC code as an inner code (e.g., LDPC). The data stream is then modulated via the modulator 519, for transmission via the antenna 521, on a row-by-row basis, as follows:

| LDPC Packet 0 | LDPC Packet m | ... | LDPC Packet nm |
| LDPC Packet 1 | LDPC Packet m + 1 | ... | LDPC Packet nm + 1 |
| LDPC Packet 2 | LDPC Packet m + 2 | ... | LDPC Packet nm + 2 |
| . | . | | . |
| . | . | | . |
| . | . | | . |
| LDPC Packet m − 1 | LDPC Packet 2m − 1 | ... | LDPC Packet (n + 1)m − 1 |
| LDPC Parity Packet 0 | LDPC Parity Packet 1 | | LDPC Parity Packet n |

At the receiver 520, the transmitted data stream is received via the antenna 531, and the demodulator 529 demodulates the received transmission to retrieve the transmitted data packets. The inner decoder 527 attempts to decode each packet. If the inner code is an LDPC code, the parity check equations of the inner decoder 527 indicate whether a particular packet has been correctly decoded or not. For other kinds of inner codes, such as turbo or convolutional codes, or for the case where there is no inner code, CRC bits can be used to determine whether each packet is successfully received. The de-interleaver 525 de-interleaves the packets to present them to the outer decoder 523 in the original column-by-column order. Unsuccessful packets would then be recovered based on the single parity check coding of the outer code and the associated successfully received packets in the same column as the unsuccessful packet (in other words, the other packets covered by the respective single parity check code packet). As a result, the original message data 521 is recovered from the received transmission.

Accordingly, in view of example embodiments, because the parameters of the channel are well defined and known (e.g., the blockage period and blockage duration are known), the parameters of the interleaver can be set to capture a number of blocked packets that does not exceed the capabilities of the FEC coding. Further, the total number of packets in a row/column interleaver should not exceed the number of packets sent between sequential blockages of the two blades of the helicopter, so that only one blockage event affects the packets in an interleaver block.

As would be recognized by one of ordinary skill in the art, a more powerful outer coding scheme is possible. For example, a more powerful FEC coding can be employed for recovery of more than one lost packet within a number of packets, and thereby reduce the required interleaver length. Such more powerful FEC codes, however, require significantly more complexity and overhead, and thus come at significantly higher costs (in both processing and implementation). Whereas, a single parity check code, such as the checksum coding described above, represent one of the simplest codes from a complexity and overhead standpoint, and the interleaver adds relatively low additional complexity as compared to a more powerful, multi-parity check codes for correction of multiple errors. Furthermore, in view of the fact that the channel impairments due to the periodic blockage of the helicopter blades are discernible, according to example embodiments, this knowledge of the channel is exploited to enable use of a relatively simple outer FEC code and interleaver. Whereas, in cases of thermal noise and other channel impairments, which are generally of an unknown and unpredictable behavior, more complex FEC coding (e.g., turbo codes or LDPC coding) is required for error correction.

In accordance with further example embodiments, a system is provided for the transmission of signals by a terminal where the transmissions are subject to periodic blockages, for example, by blades of a helicopter that employs multiple different rotors (e.g., two rotors). The previously described embodiments may still be applicable to larger aircraft that employ multiple rotors, such as where the satellite antenna can be mounted in a position whereby the transmission signals are only interrupted by blades from one rotor at a time. The following further embodiments, however, address alternate multi-rotor situations.

Figure 6A:
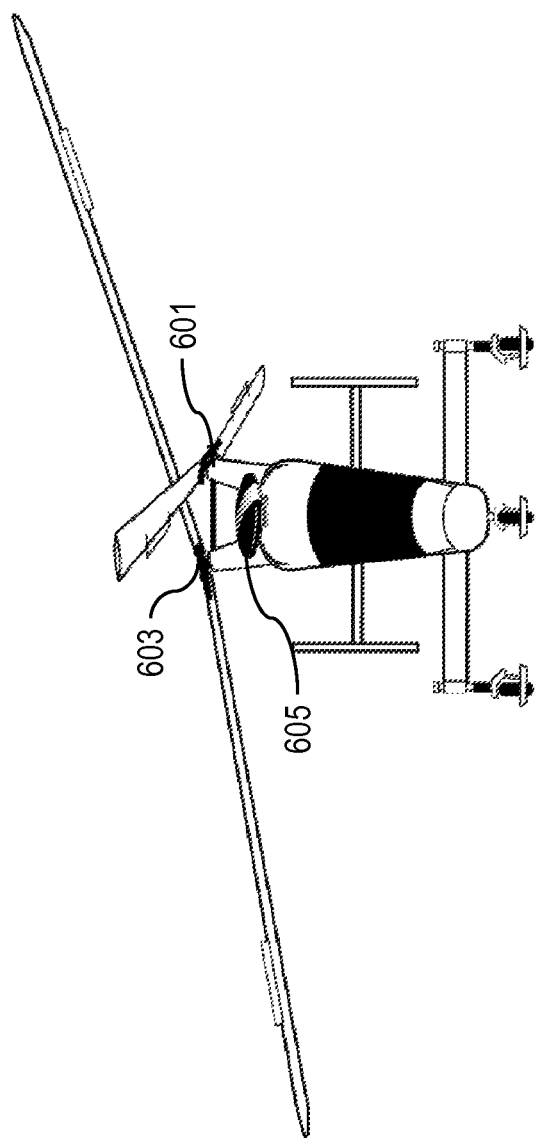
FIG. 6A illustrates a front-view of a satellite antenna mounted on a helicopter with two rotors, such as a K-Max helicopter, according to example embodiments.
Figure 6B:
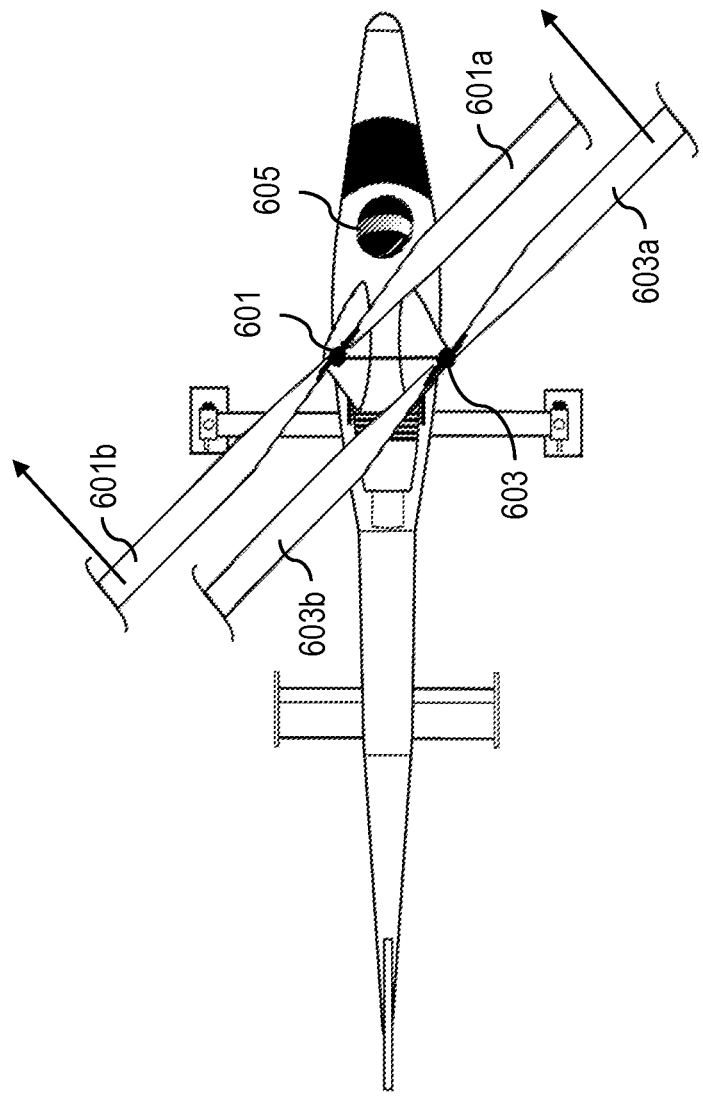
FIG. 6B illustrates a top-view of the satellite antenna mounted on the helicopter with two rotors, of FIG. 6A, according to example embodiments.
Figure 6D:
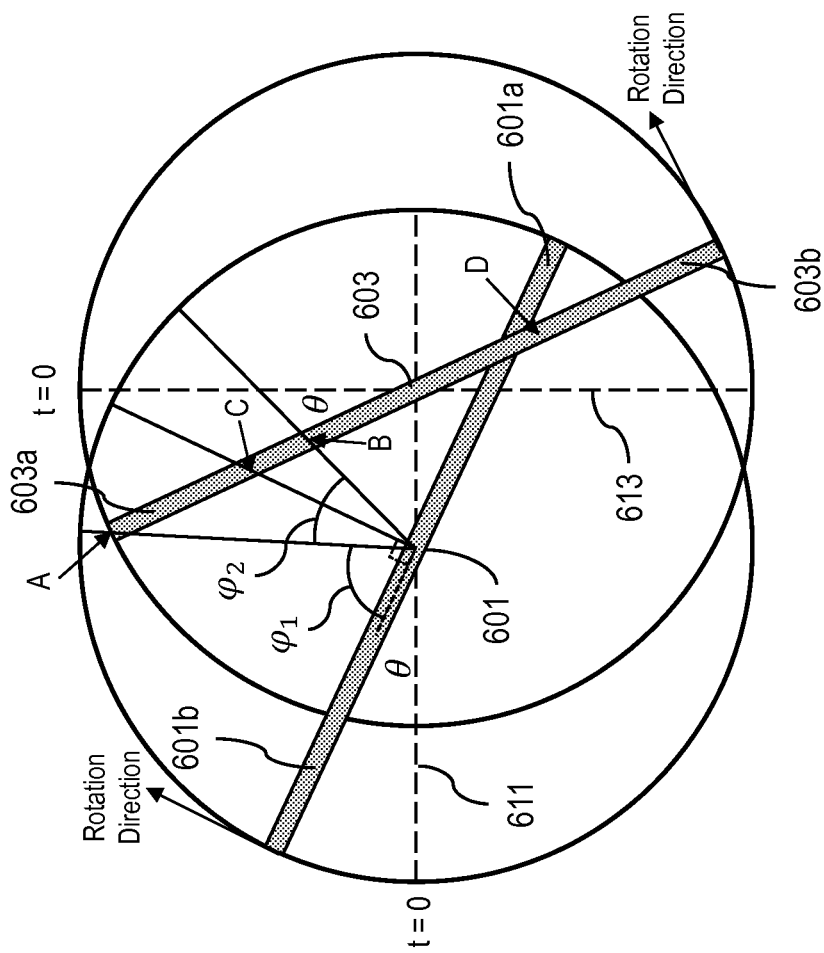
FIG. 6D illustrates positions of the rotors of the helicopter of FIGS. 6A and 6B relative to the satellite terminal at different time offsets relative to a start time, according to example embodiments.

FIG. 6A illustrates a front-view of a satellite antenna mounted on a helicopter with two rotors, such as a K-Max helicopter, and FIG. 6B illustrates a top-view of the satellite antenna mounted on the helicopter with two rotors, of FIG. 6A, according to example embodiments. Further, FIG. 6C illustrates timing relationships with respect to the rotors of the helicopter of FIGS. 6A and 6B and the relative periods of interference with the satellite terminal, and FIG. 6D illustrates positions of the rotors of the helicopter of FIGS. 6A and 6B relative to the satellite terminal at different time offsets relative to a start time, according to example embodiments. There are different types of such multi-rotor helicopters, but the K-Max (depicted in FIGS. 6A and 6B) represents a potentially worst case example.

With reference to FIGS. 6A and 6B, the helicopter of this example is equipped with two rotors 601 and 603, with each rotor having two blades (blades 601a and 601b of rotor 601, and blades 603a and 603b of rotor 603). Each rotor is disposed at an angle slightly outward from the body of the helicopter so as to avoid interference with the other rotor. The rotors spin in opposite directions from each other and are synchronized, also so that blades of each rotor will not interfere with the blades of the other rotor. In the example of FIGS. 6A and 6B, one satellite dish 605 is centrally mounted to the top portion of the body of the helicopter just behind the front windshield. Accordingly, with one full rotation of each of the rotors, there will be occurrences of a blade interfering with signals transmitted to and from the satellite terminal. For example, where the rotors are spinning in the respective directions of the arrows depicted in FIG. 6B, the blades will interfere with the satellite terminal 605 in the following order, first blade 603a, then blade 601b, then blade 603b, and finally blade 601a.

With reference to FIG. 6C, however, depending on the relative heading of the helicopter and the position of the satellite terminal 605 with respect to the satellite, the blockages caused by the blades of each rotor will have different time offsets, and will exhibit different blockage durations, from each other. The period between blockages for rotor 603 is depicted as P603, and the period between blockages for rotor 601 is depicted as P601. The period P between each blade of the same rotor is relatively equal. Then, as the rotor 603 spins, the respective widths (in time) of the blockages by its blades are respectively depicted as W603a and W603b, and as the rotor 601 spins, the respective widths (in time) of the blockages by its blades are respectively depicted as W601a and W601b. Accordingly, the time T between the interference of one blade of one rotor and the next blade of the other rotor varies depending on the location of the satellite with respect to the antenna 605. Similarly, the width (in time) of the respective blockages of the blades of each rotor (W601 and W603) also vary depending on the location of the satellite with respect to the antenna 605. As is evident from the figure, the total available transmission time of a period ($P_T$) is P−W1−W2, where the period P reflects the period from the beginning of the blockage by one blade of a rotor in the beginning of the blockage by the next blade of that rotor (e.g., P603 or P601), and W1 reflects the width of the blockage of a blade of one rotor (e.g., W603a) and W1 reflects the width of the blockage of a blade of the other rotor (e.g., W601b). In other words, out of a total period of P, there is a total unblocked transmission time of P−W1−W2 versus a total blockage time of W1+W2 of unavailable time. Further, because the rotors rotate in a synchronized fashion, the period P603=P601=P, and the period P reflects a rotation of the rotors by 180 degrees (the time between the beginning of one blade of a rotor intersecting the signal path between the satellite and the antenna and the beginning of the other blade of the same rotor intersecting the signal path reflects a rotation of the rotor by 180 degrees).

With reference now to FIG. 6D, the relative position at which the transmission is intercepted by the blades determines the relative time offset T. At time t=0, for example, the blades 601 and 603 are at the dashed positions 611 and 613, respectively. Now, assuming that the signal path between the antenna and the satellite intercepts the blades at a point between points A and B, both points and all points in-between are blocked by the blade 603a after the rotors have rotated by θ degrees (where the resulting respective blade positions are shown by the shaded gray blades). Further, the following discussion will assume that the rotation point of θ degrees reflects the beginning of the period P. If the location of the satellite relative to the antenna results in the blade 603a intersecting the signal path at point A, then point A will subsequently be blocked by the blade 601b after a further rotation of the rotors by $\phi_1$ degrees ($\phi_1$<90°). Alternatively, if the location of the satellite relative to the antenna results in the blade 603a intersecting the signal path at point B, then point B will subsequently be blocked by the blade 601b after a further rotation of the rotors by $\phi_1+\phi_2$ degrees ($\phi_i+\phi_2$>90°). In either of these cases with regard to intersection of the signal path at points A and B, there will be two blockages of the signal path (e.g., W603a and W601b) within the period P.

In the event that the location of the satellite relative to the antenna results in the blade 603a intersecting the signal path at point C, then point C will subsequently be blocked by the blade 601b after a further rotation of the rotors by 90 degrees from the position of the θ degree rotation. Accordingly, at point C, T is about ½ of the period P or the available transmission time, and thus the time between the signal blockage by a first blade of a first rotor and the next blockage by a first blade of the second rotor will be approximately equal to the time between the blockage by the first blade of the second rotor and the next blockage by the second blade of the first rotor. Further, in the case where the blade 603b intersects the signal path between the satellite and the antenna at point D, the blade 601a will intersect signal path almost immediately thereafter. As such, there is effectively only one blockage of a duration equivalent to the duration of the blockage for each blade added together. In either of these scenarios (where the signal blockage of the blade 603a is at point C or the signal blockage of the blade 603b is at point D), blockage effectively resembles a single rotor blockage, where in one case the period between blockages is merely one half of the period P, and in the other case there is a single signal blockage amounting to the duration of the blockage of each blade successively occurring at the period P. Thus, the single rotor solution described above may be applied in these special cases. Such special cases, however, are the exception rather than the rule, and in most cases the time T between the end of the blockage of the blade of one rotor and the beginning of the next blockage of a blade of the other rotor can be any value between 0 to ½ of the available time or the period P.

Accordingly, in most cases where the timing relationship between the two sets of blades can be almost contiguous or next to each other, and being as far apart as ½ of the period, the foregoing regularly interleaved single parity check scheme for the single rotor case (or the special cases for the dual rotor scenario) would not be effective. This is because, in the two rotor scenario, as a result of the interleaving, each code block no longer includes only one error and thus the single parity check schemes applied to the single rotor case would no longer be effective. In accordance with example embodiments of the present invention, therefore, the outer parity check code (within the framework discussed above with regard to the single rotor scenario) is replaced with a two erasure error correction code, along with an adjustment of the interleaver parameters to enable uninterrupted transmission to the satellite. In other words, the interleaving is applied to achieve two erasures within each codeblock, and a code is applied to correct for two erasures within a single code block, whereby the receiver knows the location of the erasures but simply does not know the status of the erased bits.

According to certain two erasure code embodiments, a family of modified Hamming codes can be applied, where an overall parity check bit is added to the original Hamming code. Such cases present a two erasure code of a single dimension. By way of example, an (8,4) code Hamming code of rate 0.5, and a (16,11) code of rate 0.6875 may be used. By way of further example, longer codes, such as (32,26), may be used to achieve higher code rates. Further, the modified Hamming code can be shortened if need to achieve a certain bit rate, for example, based on system design. Because Hamming codes are generally $2^n-1$ (and, with the added overall parity check bit, are $2^n$), to achieve a specific code rate between two available Hamming codes, shortening may be required. By way of example, as one method for shortening, the number of transmitted information bits may be reduced (e.g., a certain number of the beginning information bits can be set to zero (and not transmitted), whereby the receiving end understands that the omitted information bits are zero and would thereby be capable of decoding the received bits accordingly). The shortening reduces the code rate and reduces throughput, but may be useful to fit the interleaver parameters, and may result in a simpler implementation. For example, if the block length can be longer than 16 (the (16,11) Hamming code is too short), it can be obtained by shortening the (32,26) code for better efficiency. By way of further example, another method of shortening comprises puncturing, whereby the parity bits are punctured in an appropriate fashion to achieve the desired code rate and acceptable performance.

According to further two erasure code embodiments, product codes of two parity check codes can be applied. In such cases, a two dimensional code is applied with a parity check in each dimension or direction. By way of example, a product code with two rate 4/5 parity check codes can be implemented to construct an overall rate 0.64 code with a block length of 25. By way of further example, a product code may be constructed from two different parity check codes, for example one with rate 3/4 and the other with rate 4/5, which yields a rate 0.6 code. As will be appreciated, other combinations of product codes consisting of two parity check codes can be constructed depending on desired throughput/bit rates.

Of the foregoing two options, however, as would be understood, a modified Hamming code approach would provide a higher code rate for a smaller overall block length, which is more desirable to minimize the implementation complexity. Further, any of these approaches may be applied to a single rotor aircraft scenario as well.

Figure 7:
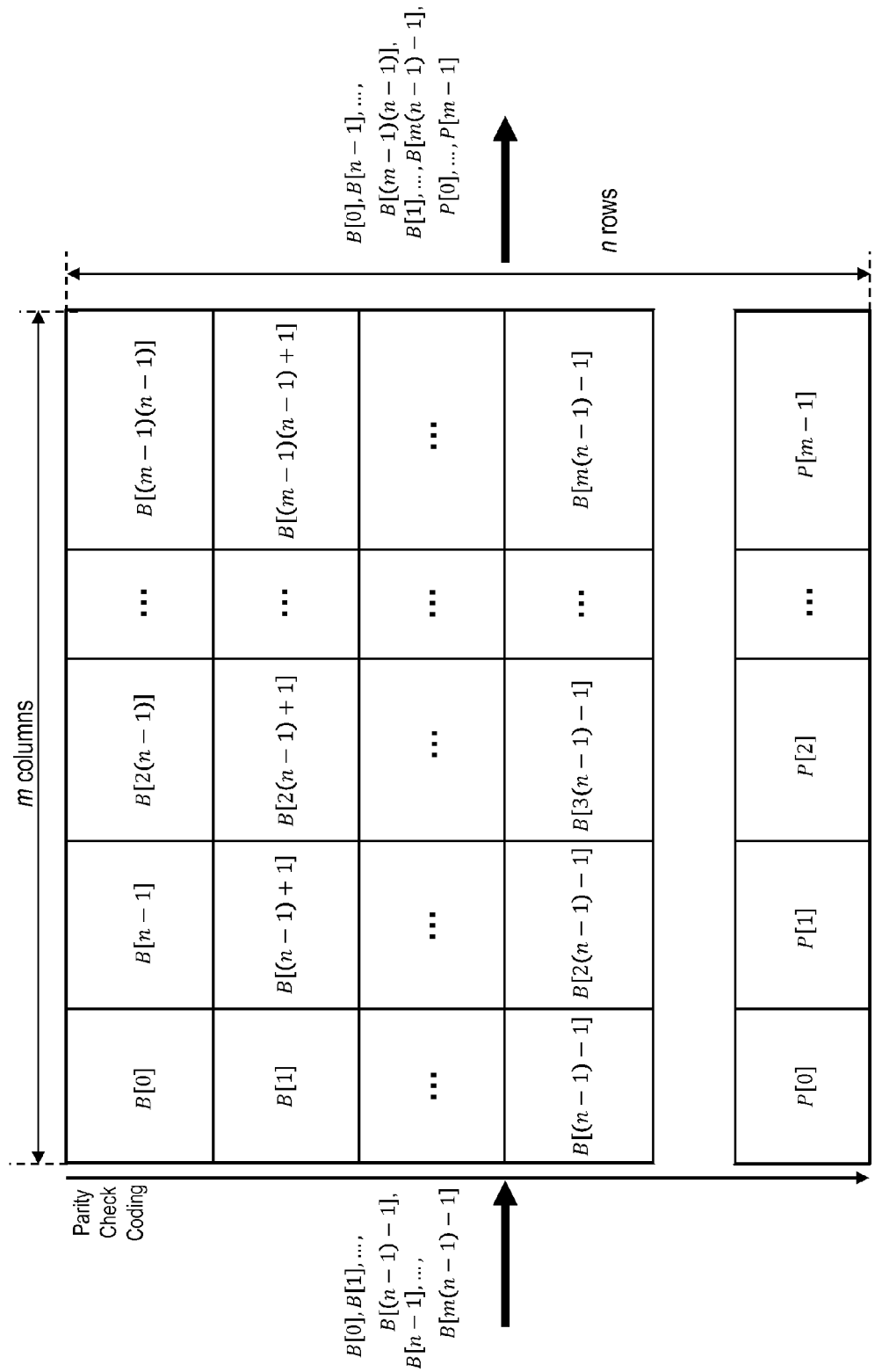
FIG. 7 illustrates an interleaver parameter table, according to example embodiments.

FIG. 7 illustrates an interleaver parameter table, according to example embodiments. In accordance with example embodiments for two erasure outer codes, with regard to the interleaver parameters, the overall buffer size n×m should be smaller than the period P. Further, the interleaver depth m should be longer than the larger of the two respective blockage durations of a period P (the larger of the two respective blockage durations of the two different rotor blades within the period). For example, with reference to FIG. 6C, the interleaver depth m should reflect a longer period than the maximum of two blockages of a period, W=max(W$601a$, W$601b$) or W=max(W$603b$, W$601a$). As such, the result of the interleaving would ensure that there are no more than two erasures per codeblock. Further, because the codeblock and blade movement are not synchronized, the interleaver depth should be larger than W (e.g., W+1). Further, in accordance with one embodiment, to provide for some margin of error for P and W, the code block length is made less than P/(W+1) or n<P/(W+1). Then, with the same interleaver structure, instead of one row of parity check blocks, an implementation with n–k rows of parity check blocks would facilitate double erasure correction.

In accordance with further example embodiments of the present invention, long low density parity check (LDPC) codes may be applied for the outer coding. According to certain LDPC embodiments, an LDPC outer code can be applied with a block size equal to the interleaver size n×m, which can be equivalent to many multiples of P (where performance improves as the block size increases). In other words, with an appropriate LDPC code, there is no longer a benefit to restricting the number of erasures per code block to two erasures, and instead each codeblock may reflect multiple periods with multiple erasures or errors. Further, with such LDPC codes, because there is no need to divide the outer encoded bits in to small codeblocks, additional bandwidth efficiency is realized as a result of reduced overhead. By way of example, the degree distribution of the outer LDPC code is designed for optimization of the erasure decoding performance.

In accordance with example embodiments for long LDPC outer codes, with regard to the interleaver parameters, the interleaver is designed to avoid the occurrence of consecutive parity erasures. In other words, the interleaver is implemented to shuffle the encoded bits in order to avoid the situation where, as a result of the rotor blade signal blockages within any given codeblock, consecutive LDPC parity bits are blocked/erased. Based on the nature of an LDPC code (e.g., the LDPC codes of the ETSI DVB-S2 standard), because of the staircase structure in the parity of the codeblock, consecutive parity erasures adversely affect the error correction performance of the code. According to example embodiments, a rectangular interleaver is implemented, where the interleaver is filled row-by-row (as with the shorter code embodiments discussed above), with the exception that, before being written into the interleaver, each row is shuffled among itself according to the rule or scheme $k \rightarrow (k \times c_i) \bmod m$, where $c_i$ is a row-dependent constant (each row is shuffled based on a different constant) and m is the number of columns. Further, the row dependent constant $c_i$ for each row i is selected such that each of the row indices (each position within a row) is generated only once, and such that $c_i$ and m are relatively prime ($c_i$ and m are not each prime numbers, but they do not have any common divisors). The shuffling of each row randomizes the bits so that after deinterleaving at the receiver, the erasures appear random. After shuffling, the rows of the interleaver are then read out in a row-by-row manner. In accordance with one embodiment, a rate 4/5 LDPC code may be applied with an interleaver, where the number of rows n is set at 160 and the number of columns m is set at 800, and where the row-dependent constants $c_i$, i=0, 1, 2, . . . , 159 may be as follows:

| | | | | | | | |
|---|---|---|---|---|---|---|---|
| 313, | 563, | 667, | 539, | 343, | 461, | 53, | 181, |
| 421, | 531, | 397, | 703, | 389, | 721, | 661, | 551, |
| 123, | 133, | 41, | 747, | 789, | 199, | 561, | 131, |
| 17, | 629, | 357, | 333, | 41, | 99, | 563, | 233, |
| 411, | 437, | 47, | 307, | 779, | 189, | 311, | 671, |
| 603, | 83, | 317, | 379, | 197, | 769, | 373, | 621, |
| 69, | 113, | 553, | 509, | 431, | 439, | 673, | 9, |
| 23, | 353, | 671, | 77, | 387, | 401, | 401, | 363, |
| 261, | 797, | 147, | 207, | 319, | 649, | 477, | 81, |
| 61, | 753, | 79, | 619, | 69, | 267, | 687, | 379, |
| 493, | 187, | 343, | 201, | 387, | 757, | 511, | 507, |
| 479, | 677, | 427, | 727, | 551, | 559, | 591, | 621, |
| 17, | 127, | 237, | 259, | 83, | 583, | 363, | 731, |
| 779, | 217, | 197, | 103, | 29, | 19, | 297, | 171, |
| 27, | 43, | 453, | 307, | 177, | 737, | 207, | 259, |

-continued

| 499, | 159, | 523, | 783, | 609, | 19, | 791, | 329, |
| 281, | 329, | 89, | 103, | 167, | 353, | 9, | 691, |
| 333, | 687, | 153, | 349, | 501, | 353, | 457, | 267, |
| 691, | 343, | 317, | 327, | 533, | 373, | 393, | 201, |
| 201, | 729, | 431, | 783, | 71, | 613, | 371, | 441. |

Figure 8:
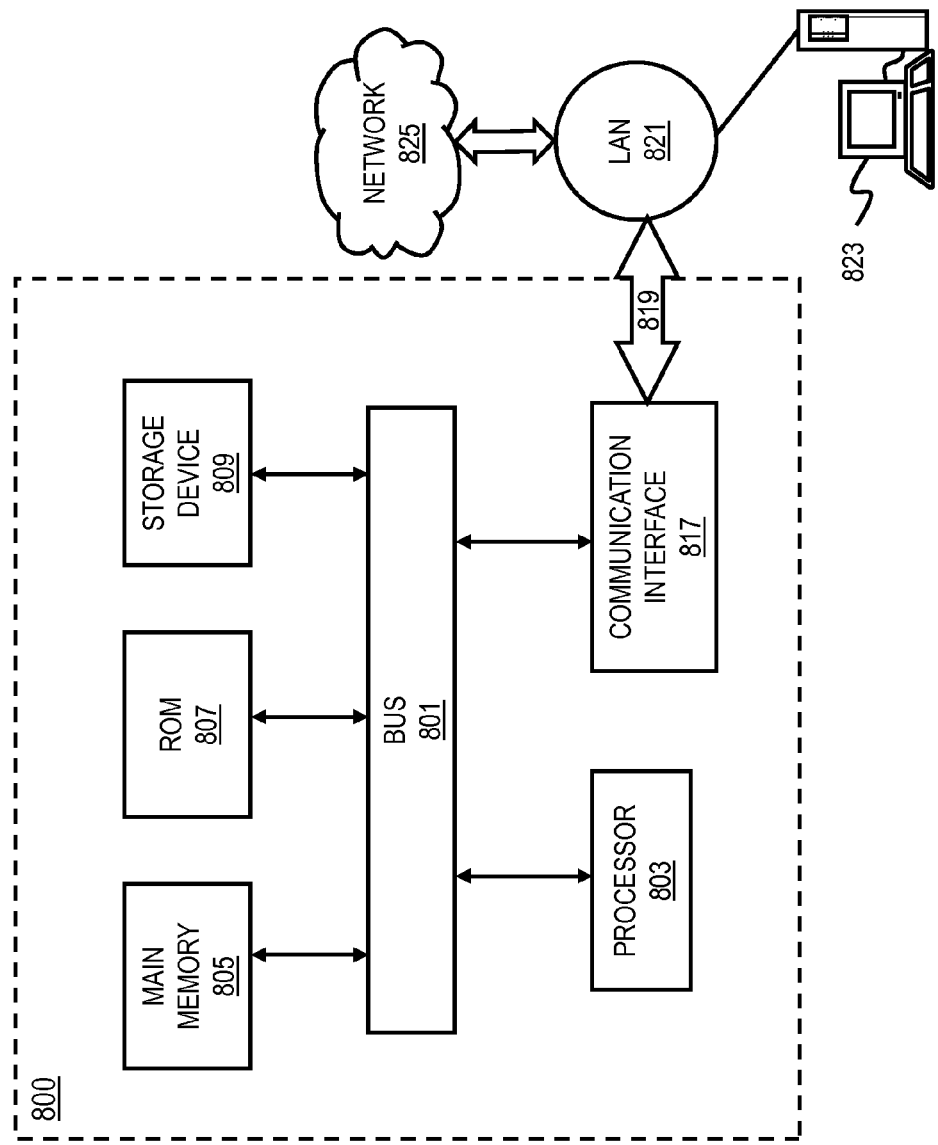
FIG. 8 is a diagram of a computer system for implementing encoding approaches, according to example embodiments.

FIG. 8 illustrates a computer system upon which example embodiments according to the present invention can be implemented. The computer system 800 includes a bus 801 or other communication mechanism for communicating information, and a processor 803 coupled to the bus 801 for processing information. The computer system 800 also includes main memory 805, such as a random access memory (RAM) or other dynamic storage device, coupled to the bus 801 for storing information and instructions to be executed by the processor 803. Main memory 805 can also be used for storing temporary variables or other intermediate information during execution of instructions to be executed by the processor 803. The computer system 800 further includes a read only memory (ROM) 807 or other static storage device coupled to the bus 801 for storing static information and instructions for the processor 803. A storage device 809, such as a magnetic disk or optical disk, is additionally coupled to the bus 801 for storing information and instructions.

According to one embodiment of the invention, generation and operation of interleaver designs in accordance with example embodiments is provided by the computer system 800 in response to the processor 803 executing an arrangement of instructions contained in main memory 805. Such instructions can be read into main memory 805 from another computer-readable medium, such as the storage device 809. Execution of the arrangement of instructions contained in main memory 805 causes the processor 803 to perform the process steps described herein. One or more processors in a multi-processing arrangement may also be employed to execute the instructions contained in main memory 805. In alternative embodiments, hard-wired circuitry may be used in place of or in combination with software instructions to implement the embodiment of the present invention. Thus, embodiments of the present invention are not limited to any specific combination of hardware circuitry and software.

The computer system 800 also includes a communication interface 817 coupled to bus 801. The communication interface 817 provides a two-way data communication coupling to a network link 819 connected to a local network 821. For example, the communication interface 817 may be a digital subscriber line (DSL) card or modem, an integrated services digital network (ISDN) card, a cable modem, or a telephone modem to provide a data communication connection to a corresponding type of telephone line. As another example, communication interface 817 may be a local area network (LAN) card (e.g. for Ethernet™ or an Asynchronous Transfer Model (ATM) network) to provide a data communication connection to a compatible LAN. Wireless links can also be implemented. In any such implementation, communication interface 817 sends and receives electrical, electromagnetic, or optical signals that carry digital data streams representing various types of information. Further, the communication interface 817 can include peripheral interface devices, such as a Universal Serial Bus (USB) interface, a PCMCIA (Personal Computer Memory Card International Association) interface, etc.

The network link 819 typically provides data communication through one or more networks to other data devices. For example, the network link 819 may provide a connection through local network 821 to a host computer 823, which has connectivity to a network 825 (e.g. a wide area network (WAN) or the global packet data communication network now commonly referred to as the "Internet") or to data equipment operated by service provider. The local network 821 and network 825 both use electrical, electromagnetic, or optical signals to convey information and instructions.

The computer system 800 can send messages and receive data, including program code, through the network(s), network link 819, and communication interface 817. In the Internet example, a server (not shown) might transmit requested code belonging to an application program for implementing an embodiment of the present invention through the network 825, local network 821 and communication interface 817. The processor 803 may execute the transmitted code while being received and/or store the code in storage device 239, or other non-volatile storage for later execution.

Terminology referring to computer-readable media or computer media or the like as used herein refers to any medium that participates in providing instructions to the processor of a computer or processor module or component for execution. Such a medium may take many forms, including but not limited to non-transitory non-volatile media and volatile media. Non-volatile media include, for example, optical disk media, magnetic disk media or electrical disk media (e.g., solid state disk or SDD). Volatile media include dynamic memory, such random access memory or RAM. Common forms of computer-readable media include, for example, floppy or flexible disk, hard disk, magnetic tape, any other magnetic medium, CD ROM, CDRW, DVD, any other optical medium, random access memory (RAM), programmable read only memory (PROM), erasable PROM, flash EPROM, any other memory chip or cartridge, or any other medium from which a computer can read data.

Further, as will be appreciated, a module or component (as referred to herein) may be composed of software component(s), which are stored in a memory or other computer-readable storage medium, and executed by one or more processors or CPUs of the respective devices. As will also be appreciated, however, a module may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in a computer memory store.

Figure 9:
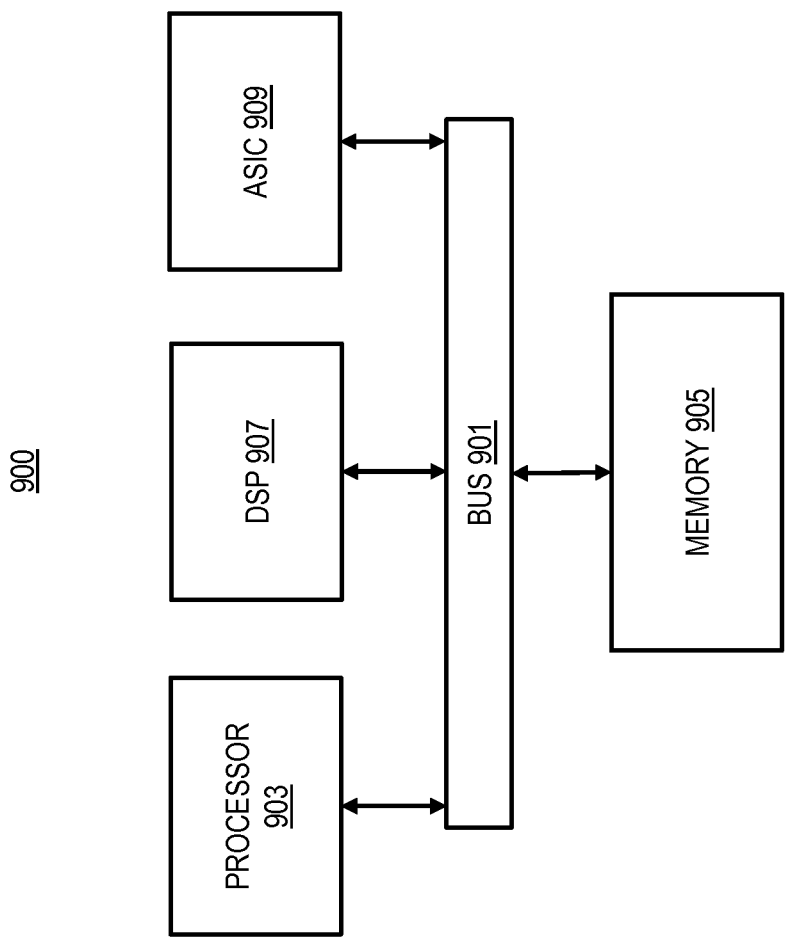
FIG. 9 is a diagram of a chip set for implementing encoding approaches, according example embodiments.

FIG. 9 illustrates a chip set 900 in which embodiments of the invention may be implemented. Chip set 900 includes, for instance, processor and memory components described with respect to FIG. 9 incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, the chip set 900 includes a communication mechanism such as a bus 901 for passing information among the components of the chip set 900. A processor 903 has connectivity to the bus 901 to execute instructions and process information stored in, for example, a memory 905. The processor 903 may include one or more processing cores with each core configured to perform independently. A multi-core processor enables multiprocessing within a single physical package. Examples of a multi-core processor include two, four, eight, or greater numbers of processing cores. Alternatively or in addition, the processor 903 may include one or more microprocessors configured in tandem via the bus 901 to enable independent execution of instructions, pipelining, and multithreading. The processor 903 may also be accompanied with one or more specialized components to perform certain processing functions and tasks such as one or more digital signal processors (DSP) 907, and/or one or more application-specific integrated circuits (ASIC) 909. A DSP 907 typically is configured to process real-world signals (e.g., sound) in real time independently of the processor 903. Similarly, an ASIC 909 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 903 and accompanying components have connectivity to the memory 905 via the bus 901. The memory 905 includes both dynamic memory (e.g., RAM) and static memory (e.g., ROM) for storing executable instructions that, when executed by the processor 903 and/or the DSP 907 and/or the ASIC 909, perform the process of example embodiments as described herein. The memory 905 also stores the data associated with or generated by the execution of the process.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method, comprising:
   segmenting a data stream into packets of a fixed-size for a burst-mode transmission over a wireless channel, wherein the transmission is subject to a periodic blockage, wherein the periodic blockage comprises at least two blockages occurring within a time period, and each blockage is of a respective duration and recurs at regular intervals based on the time period;
   applying a forward error correction (FEC) outer code to the packets of the data stream for recovery of data erasures due to the periodic blockage, wherein the application of the FEC outer code comprises applying an error correction code to each of the packets to generate a respective codeblock;
   interleaving each codeblock to substantially prevent erasure of consecutive parity bits within the codeblock by the periodic blockage, wherein the interleaving of each codeblock comprises writing each bit of the codeblock into an interleaver matrix of n rows and m columns in a row-by-row mode, shuffling the bits of each row within the row, and reading the shuffled bits from each row of the interleaver matrix in the row-by-row mode, and wherein the shuffling of the bits of each row comprises shuffling each bit of an original position k within the row to a new position within the row according to the following scheme: $k \rightarrow (k \times c_i) \mod m$, where $c_i$ is a row-dependent constant; and
   transmitting the encoded and interleaved codeblocks over the wireless channel, wherein a number of the data erasures occur within each codeblock due to the periodic blockage.

2. The method of claim 1, wherein the FEC outer code comprises a low density parity check code configured to optimize the recovery of the number of data erasures within each codeblock.

3. The method of claim 1, wherein $c_i$ and m are relatively prime.

4. The method of claim 1, wherein the FEC outer code comprises a rate 4/5 low density parity check code, n=160, m=800, and the values of $c_i$, i=0, 1, 2, ..., 159 are as follows:

| | | | | | | | |
|---|---|---|---|---|---|---|---|
| 313, | 563, | 667, | 539, | 343, | 461, | 53, | 181, |
| 421, | 531, | 397, | 703, | 389, | 721, | 661, | 551, |
| 123, | 133, | 41, | 747, | 789, | 199, | 561, | 131, |
| 17, | 629, | 357, | 333, | 41, | 99, | 563, | 233, |
| 411, | 437, | 47, | 307, | 779, | 189, | 311, | 671, |
| 603, | 83, | 317, | 379, | 197, | 769, | 373, | 621, |
| 69, | 113, | 553, | 509, | 431, | 439, | 673, | 9, |
| 23, | 353, | 671, | 77, | 387, | 401, | 401, | 363, |
| 261, | 797, | 147, | 207, | 319, | 649, | 477, | 81, |
| 61, | 753, | 79, | 619, | 69, | 267, | 687, | 379, |
| 493, | 187, | 343, | 201, | 387, | 757, | 511, | 507, |
| 479, | 677, | 427, | 727, | 551, | 559, | 591, | 621, |
| 17, | 127, | 237, | 259, | 83, | 583, | 363, | 731, |
| 779, | 217, | 197, | 103, | 29, | 19, | 297, | 171, |
| 27, | 43, | 453, | 307, | 177, | 737, | 207, | 259, |
| 499, | 159, | 523, | 783, | 609, | 19, | 791, | 329, |
| 281, | 329, | 89, | 103, | 167, | 353, | 9, | 691, |
| 333, | 687, | 153, | 349, | 501, | 353, | 457, | 267, |
| 691, | 343, | 317, | 327, | 533, | 373, | 393, | 201, |
| 201, | 729, | 431, | 783, | 71, | 613, | 371, | 441. |

5. The method of claim 1, further comprising:
   adding a unique word (UW) to each of the packets of the data stream for acquisition of one or more of a frequency, carrier phase and symbol timing of the respective packet.

6. The method of claim 1, further comprising:
   applying a forward error correction (FEC) inner code to each encoded and interleaved codeblock.

7. The method of claim 6, wherein the FEC inner code comprises one of a low density parity check code (LDPC), a convolutional code, and a turbo code.

8. The method of claim 1, wherein:
   the wireless channel comprises a channel in a satellite communications system;
   the transmission comprises a data transmission of a satellite terminal installed on a helicopter having multiple rotor blades; and
   each blockage within the time period comprises a blockage by a blade of a respective one of the rotors.

9. An apparatus, comprising:
   at least one processor; and
   at least one memory including computer program code for one or more programs,
   the at least one memory and the computer program code configured to, with the at least one processor, cause the apparatus to perform at least the following, segment a data stream into packets of a fixed-size for a burst-mode transmission over a wireless channel, wherein the transmission is subject to a periodic blockage, wherein the periodic blockage comprises at least two blockages occurring within a time period, and each blockage is of a respective duration and recurs at regular intervals based on the time period;

apply a forward error correction (FEC) outer code to the packets of the data stream for recovery of data erasures due to the periodic blockage, wherein the application of the FEC outer code comprises applying an error correction code to each of the packets to generate a respective codeblock;

interleave each codeblock to substantially prevent erasure of consecutive parity bits within the codeblock by the periodic blockage, wherein the interleaving of each codeblock comprises writing each bit of the codeblock into an interleaver matrix of n rows and m columns in a row-by-row mode, shuffling the bits of each row within the row, and reading the shuffled bits from each row of the interleaver matrix in the row-by-row mode, and wherein the shuffling of the bits of each row comprises shuffling each bit of an original position k within the row to a new position within the row according to the following scheme:

k→(k×$c_i$) mod m, where $c_i$ is a row-dependent constant; and transmit the encoded and interleaved codeblocks over the wireless channel, wherein a number of the data erasures occur within each codeblock due to the periodic blockage.

10. The apparatus of claim 9, wherein the FEC outer code comprises a low density parity check code configured to optimize the recovery of the number of data erasures within each codeblock.

11. The apparatus of claim 9, wherein $c_i$ and m are relatively prime.

12. The apparatus of claim 9, wherein the FEC outer code comprises a rate 4/5 low density parity check code, n=160, m=800, and the values of $c_i$, i=0, 1, 2, ..., 159 are as follows:

| | | | | | | | |
|---|---|---|---|---|---|---|---|
| 313, | 563, | 667, | 539, | 343, | 461, | 53, | 181, |
| 421, | 531, | 397, | 703, | 389, | 721, | 661, | 551, |
| 123, | 133, | 41, | 747, | 789, | 199, | 561, | 131, |
| 17, | 629, | 357, | 333, | 41, | 99, | 563, | 233, |
| 411, | 437, | 47, | 307, | 779, | 189, | 311, | 671, |
| 603, | 83, | 317, | 379, | 197, | 769, | 373, | 621, |
| 69, | 113, | 553, | 509, | 431, | 439, | 673, | 9, |
| 23, | 353, | 671, | 77, | 387, | 401, | 401, | 363, |
| 261, | 797, | 147, | 207, | 319, | 649, | 477, | 81, |
| 61, | 753, | 79, | 619, | 69, | 267, | 687, | 379, |
| 493, | 187, | 343, | 201, | 387, | 757, | 511, | 507, |
| 479, | 677, | 427, | 727, | 551, | 559, | 591, | 621, |
| 17, | 127, | 237, | 259, | 83, | 583, | 363, | 731, |
| 779, | 217, | 197, | 103, | 29, | 19, | 297, | 171, |
| 27, | 43, | 453, | 307, | 177, | 737, | 207, | 259, |
| 499, | 159, | 523, | 783, | 609, | 19, | 791, | 329, |
| 281, | 329, | 89, | 103, | 167, | 353, | 9, | 691, |
| 333, | 687, | 153, | 349, | 501, | 353, | 457, | 267, |
| 691, | 343, | 317, | 327, | 533, | 373, | 393, | 201, |
| 201, | 729, | 431, | 783, | 71, | 613, | 371, | 441. |

13. The apparatus of claim 9, wherein the apparatus is caused to further perform the following:

add a unique word (UW) to each of the packets of the data stream for acquisition of one or more of a frequency, carrier phase and symbol timing of the respective packet.

14. The apparatus of claim 9, wherein the apparatus is caused to further perform the following:

apply a forward error correction (FEC) inner code to each encoded and interleaved codeblock.

15. The apparatus of claim 14, wherein the FEC inner code comprises one of a low density parity check code (LDPC), a convolutional code, and a turbo code.

16. The apparatus of claim 9, wherein:

the wireless channel comprises a channel in a satellite communications system;

the apparatus consists of or is part of a satellite terminal located on a helicopter having multiple rotor blades;

the transmission comprises a data transmission of the satellite terminal; and each blockage within the time period comprises a blockage by a blade of a respective one of the rotors.

\* \* \* \* \*